(12) United States Patent
Tanaka

(10) Patent No.: US 11,309,512 B2
(45) Date of Patent: Apr. 19, 2022

(54) ORGANIC EL DISPLAY DEVICE AND METHOD FOR MANUFACTURING ORGANIC EL DISPLAY DEVICE

(71) Applicant: Sharp Kabushiki Kaisha, Sakai (JP)

(72) Inventor: Tetsunori Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 69 days.

(21) Appl. No.: 16/497,811

(22) PCT Filed: Mar. 30, 2017

(86) PCT No.: PCT/JP2017/013234
§ 371 (c)(1),
(2) Date: Sep. 26, 2019

(87) PCT Pub. No.: WO2018/179212
PCT Pub. Date: Oct. 4, 2018

(65) Prior Publication Data
US 2021/0111365 A1    Apr. 15, 2021

(51) Int. Cl.
*H01L 51/52* (2006.01)
*H01L 27/32* (2006.01)

(52) U.S. Cl.
CPC ...... *H01L 51/5218* (2013.01); *H01L 27/3276* (2013.01); *H01L 51/5234* (2013.01)

(58) Field of Classification Search
CPC ............. H01L 51/5218; H01L 51/5215; H01L 51/5253; H01L 51/5256
See application file for complete search history.

(56) References Cited

U.S. PATENT DOCUMENTS

| 2002/0033664 | A1 | 3/2002 | Kobayashi |
| 2003/0201447 | A1 | 10/2003 | Yamazaki et al. |
| 2006/0098521 | A1* | 5/2006 | Shimoda ............... H01L 27/124 365/230.06 |
| 2008/0135835 | A1* | 6/2008 | Seo ..................... H01L 51/0094 257/40 |
| 2009/0179560 | A1 | 7/2009 | Chun et al. |
| 2010/0181904 | A1 | 7/2010 | Yoshizaki et al. |

(Continued)

FOREIGN PATENT DOCUMENTS

| JP | 2004-006332 A | 1/2004 |
| JP | 2009-224118 A | 10/2009 |

(Continued)

OTHER PUBLICATIONS

Official Communication issued in International Patent Application No. PCT/JP2017/013234, dated Jun. 27, 2017.

*Primary Examiner* — Michele Fan
(74) *Attorney, Agent, or Firm* — Keating & Bennett, LLP

(57) ABSTRACT

An organic EL display device includes a reflective electrode and a transparent electrode disposed facing each other with an organic EL layer interposed therebetween. The reflective electrode includes a reflective film and a protection film formed on the reflective film, and the protection film includes a frame-shaped portion surrounding the periphery of the organic EL layer and an opening surrounded by the frame-shaped portion. This improves the reflectivity of the reflective electrode while protecting the reflective electrode.

6 Claims, 14 Drawing Sheets

(56) References Cited

U.S. PATENT DOCUMENTS

| | | | |
|---|---|---|---|
| 2011/0101888 A1* | 5/2011 | Uchida | H01L 27/3246 |
| | | | 315/312 |
| 2011/0140138 A1 | 6/2011 | Ko et al. | |
| 2014/0209914 A1 | 7/2014 | Nagasawa et al. | |
| 2015/0060819 A1 | 3/2015 | Sato et al. | |
| 2015/0077316 A1 | 3/2015 | Sato | |
| 2017/0077437 A1 | 3/2017 | Kaida et al. | |

FOREIGN PATENT DOCUMENTS

| | | | |
|---|---|---|---|
| JP | 2010-192413 A | 9/2010 | |
| JP | 2010-272447 A | 12/2010 | |
| JP | 2011-124205 A | 6/2011 | |
| JP | 2012-123987 A | 6/2012 | |
| JP | 2014-145857 A | 8/2014 | |
| JP | 2015-049972 A | 3/2015 | |
| JP | 2015-056372 A | 3/2015 | |
| JP | 2017-054718 A | 3/2017 | |
| WO | 01/63975 A1 | 8/2001 | |

* cited by examiner

ORGANIC EL DISPLAY DEVICE AND METHOD FOR MANUFACTURING ORGANIC EL DISPLAY DEVICE

TECHNICAL FIELD

The disclosure relates to an organic EL display device and a manufacturing method for an organic EL display device.

BACKGROUND ART

In an organic EL display device, an organic EL layer that emits light, a reflective electrode disposed in a lower layer of the organic EL layer, and a counter electrode disposed on an upper layer of the organic EL layer are disposed in each pixel.

In PTL 1, it is preferable that a transparent electrode having a large work function be layered on a surface of a reflective electrode, so that the transparent electrode formed of indium tin oxide (ITO) is layered on the surface of the reflective electrode.

CITATION LIST

Patent Literature

PTL 1: JP 2014-145857 A

SUMMARY

Technical Problem

According to the configuration in PTL 1, light emitted from an organic EL layer and traveling in a direction toward the reflective electrode passes through the transparent electrode formed of ITO, is reflected by the reflective electrode, passes through the transparent electrode again, and is emitted to the outside through the organic EL layer.

However, when the transparent electrode is layered on the surface of the reflective electrode, the reflectivity at the reflective electrode decreases compared with a configuration in which the transparent electrode is not layered on the surface of the reflective electrode. In particular, the reduction in reflectivity in a wavelength band of the low wavelength range such as blue is greater than that of the high wavelength range such as red.

The disclosure has been conceived in light of the above-mentioned issue of related art, and an object thereof is to improve the reflectivity of a reflective electrode while protecting the reflective electrode.

Solution to Problem

To solve the above issue, an organic EL display device according to an aspect of the disclosure includes an organic EL layer, a reflective electrode including a first reflective film, a transparent electrode disposed opposite to the reflective electrode with the organic EL layer interposed between the reflective electrode and the transparent electrode, and a first protection film disposed on the reflective electrode and arranged between the reflective electrode and the organic EL layer. Further, the first protection film includes a frame-shaped portion surrounding the periphery of the organic EL layer in a frame shape, and an opening surrounded by the frame-shaped portion or a thin film portion surrounded by the frame-shaped portion and having a film thickness thinner than a film thickness of the frame-shaped portion.

In order to solve the issue described above, a manufacturing method for an organic EL display device according to an aspect of the disclosure is a manufacturing method for an organic EL display device including a reflective electrode and a transparent electrode disposed facing each other with an organic EL layer interposed between the reflective electrode and the transparent electrode. The method includes forming a reflective film in which a first reflective film to become the reflective electrode is formed, film-forming a protection film in which a first protection film is formed on the first reflective film directly or with another layer interposed between the first protection film and the first reflective film in such a manner as to cover an entire surface of the first reflective film, and processing a protection film in which a formation region for the organic EL layer in the first protection film is removed, or a film thickness of the formation region for the organic EL layer is made thinner than a film thickness of a frame-shaped portion surrounding the formation region for the organic EL layer.

Advantage Effects of Disclosure

According to an aspect of the disclosure, an effect of improving the reflectivity of the reflective electrode is obtained while protecting the reflective electrode.

DESCRIPTION OF EMBODIMENTS

First Embodiment

A first embodiment of the disclosure will be described on the basis of FIG. 1 to FIG. 3B.

Configuration of Organic EL Display Device 1

Figure 1:
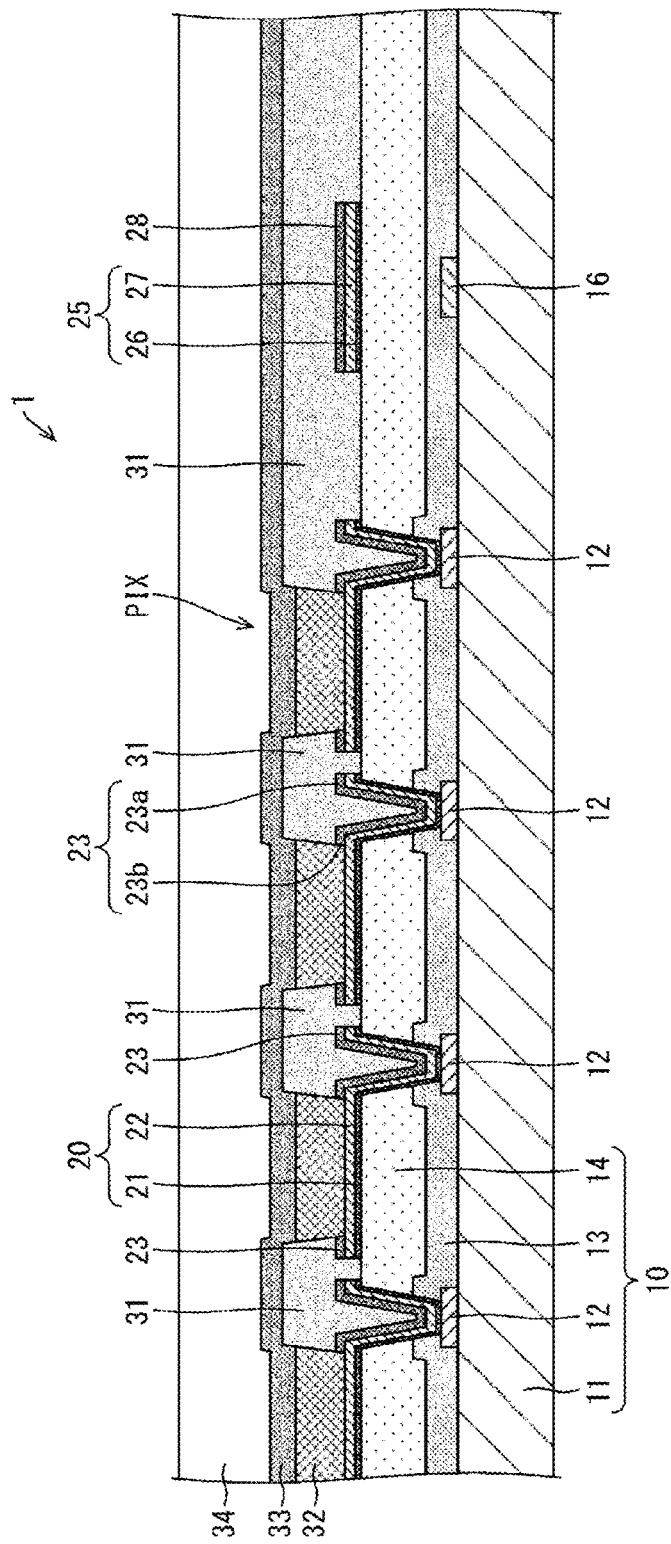
FIG. 1 is a cross-sectional view illustrating a configuration of an organic EL display device according to a first embodiment of the disclosure.

FIG. 1 is a cross-sectional view illustrating a configuration of an organic EL display device 1 according to the first embodiment of the disclosure.

In FIG. 1, of the organic EL display device 1, a display region where an image is displayed by pixels PIX arranged in a matrix shape is illustrated. The organic EL display device 1 includes, in the periphery of the display region, a frame region (not illustrated) being a peripheral region which surrounds the display region and in which no pixel PIX is arranged.

The organic EL display device 1 has a configuration in which a reflective electrode 20 and a wiring line (second wiring line) 25, a protection film (first protection film) 23 and a protection film (second protection film) 28, an organic EL layer 32, an edge cover 31, a transparent electrode 33, and a sealing layer 34 are formed on a thin film transistor (TFT) substrate 10. The organic EL display device 1 includes a drive circuit, which is not illustrated, for driving each of the pixels PIX. The organic EL display device 1 may further include a touch panel.

The TFT substrate 10 has a configuration in which a support body 11, a TFT 12 (a transistor, a drive element) and a wiring line (first wiring line) 16, a passivation film (insulating film) 13, and an interlayer insulating film (insulating film) 14 are formed in that order.

The support body 11 includes a transparent insulating material such as a plastic film or glass substrate.

The TFT 12 is a driving transistor to supply a drive current to the organic EL layer 32. The TFT 12 is formed on the support body 11 or another layer on the support body 11 in each of the pixels PIX. While not illustrated, the TFT 12 has a semiconductor layer, a gate electrode, a drain electrode, and a source electrode.

The wiring line 16 is a wiring line formed in the same layer as the gate electrode or the drain electrode and source electrode of the TFT 12. A gate wiring line connected to the gate electrode of the TFT 12 and a source wiring line connected to the source electrode of the TFT 12 are formed in the TFT substrate 10. The wiring line 16 may be the above-mentioned gate wiring line or source wiring line, or may be another wiring line. The wiring line 16 is formed in the same layer as the gate electrode of the TFT 12 in the case of the wiring line 16 being the gate wiring line, or is formed in the same layer as the source electrode of the TFT 12 in the case of the wiring line 16 being the source wiring line. The wiring line 16 may be formed in the frame region rather than in the display region. The wiring line 16 may be formed between light emitting regions (regions each surrounded by the edge cover 31 and serving as a formation region of the organic EL layer 32).

When viewed from the direction vertical to the substrate surface of the TFT substrate 10, the gate wiring line and the source wiring line are orthogonally crossed. A region defined by the gate wiring line and the source wiring line is the pixel PIX.

The passivation film 13 prevents peeling of a metal film in the TFT 12, thereby protecting the TFT 12. The passivation film 13 is formed on the support body 11 or another layer on the support body 11, to cover the TFT 12. The passivation film 13 is an inorganic insulating film including silicon nitride, silicon oxide, or the like.

The interlayer insulating film 14 provides a leveled surface over unevenness on the passivation film 13. The interlayer insulating film 14 is formed on the passivation film 13. The interlayer insulating film 14 is an organic insulating film formed of a photosensitive resin such as acrylic or polyimide.

The reflective electrode 20 is formed on the interlayer insulating film 14. The reflective electrode 20 injects (supplies) holes into the organic EL layer 32, while the transparent electrode 33 injects electrons into the organic EL layer 32. The reflective electrode 20 and the transparent electrode 33 are disposed facing each other with the organic EL layer 32 interposed therebetween. Note that the transparent electrode 33 may be semitransparent.

The organic EL layer 32 is a light emitting element able to emit high luminance light by low-voltage direct current driving. The organic EL layer 32 is formed between the reflective electrode 20 and the transparent electrode 33. A configuration that is disposed in the pixel PIX and includes the reflective electrode, the organic EL layer, and the transparent electrode is referred to as an organic EL element in some cases.

The positive holes and electrons injected into the organic EL layer 32 are recombined in the organic EL layer 32, thereby forming excitons. When the exciton having been formed is deactivated from an excited state to a ground state, light including red light, green light, blue light, or the like is released, and the released light is emitted from the organic EL layer 32 to the outside of the organic EL display device 1 while passing through the transparent electrode 33 and the sealing layer 34.

The reflective electrode 20 is electrically connected to the drain electrode of the TFT 12 via a contact hole formed in the interlayer insulating film 14 and the passivation film 13.

Figure 2:
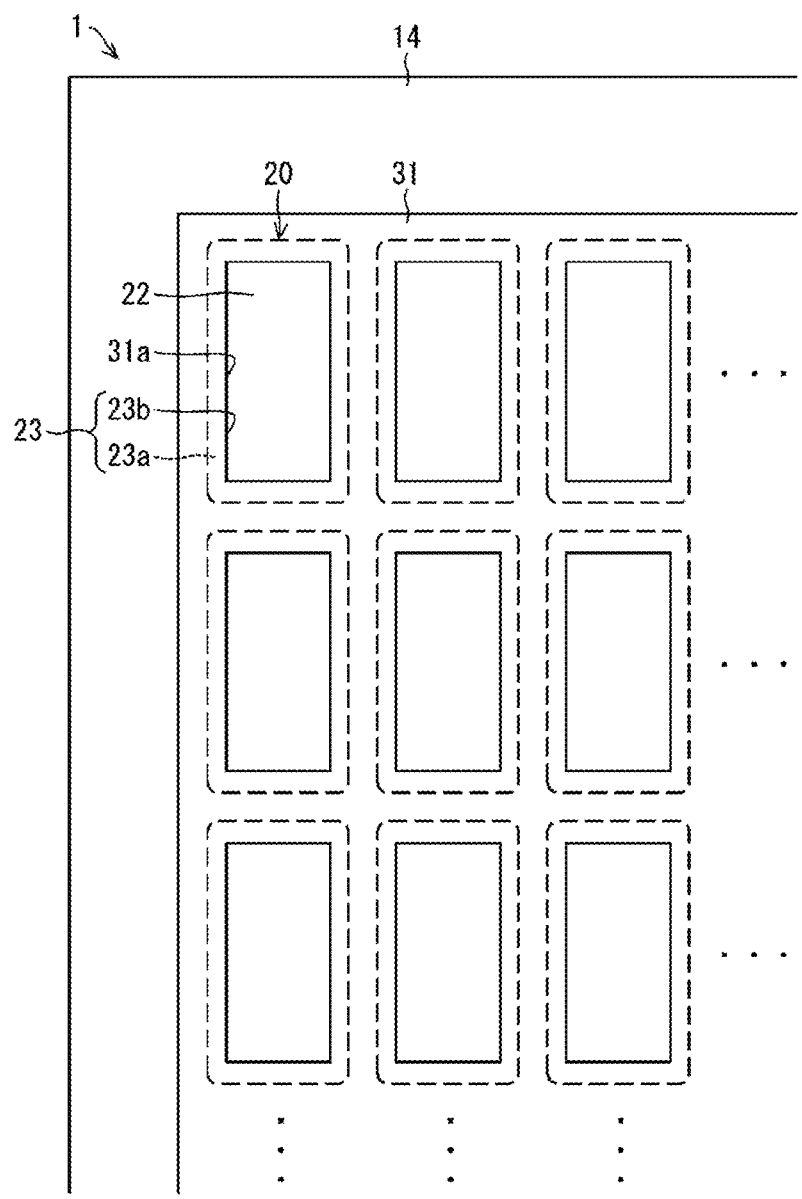
FIG. 2 is a plan view illustrating a reflective electrode and an edge cover of the organic EL display device according to the first embodiment of the disclosure.

FIG. 2 is a view illustrating a planar shape of the edge cover 31 and the reflective electrode 20. As illustrated in FIG. 1 and FIG. 2, the reflective electrodes 20 are pattern-formed while being aligned in a matrix shape for each pixel PIX.

The reflective electrode 20 includes a conductive film (first conductive film) 21 formed on the interlayer insulating film 14, and a reflective film (first reflective film) 22 formed on the conductive film 21.

The conductive film 21 is disposed between the reflective film 22 and the interlayer insulating film 14 in order to improve the adhesion between the reflective film 22 and the interlayer insulating film 14. The conductive film 21 may be formed of a conductive material capable of improving the adhesion between the reflective film 22 and the interlayer insulating film 14. As an example, in the present embodiment, the conductive film 21 is formed of ITO.

The reflective film 22 reflects light directed in a direction in which the reflective electrode 20 is disposed, out of the light emitted from the organic EL layer 32, so that the reflected light passes through the organic EL layer 32, the transparent electrode 33 and the sealing layer 34, and is emitted to the outside of the organic EL display device 1.

The reflective film 22 may include a conductive material having high reflectivity. As an example, in the present embodiment, the reflective film 22 is made of silver or a silver alloy. By using a silver alloy as the reflective film 22, it is possible to prevent a reduction in reflectivity even when heat or the like is applied during the manufacturing process of the organic EL display device 1. Examples of the silver alloy forming the reflective film 22 may include a silver-palladium-copper alloy and the like.

A protection film 23 is formed on the reflective electrode 20 (that is, on the reflective film 22). The protection film 23 includes a frame-shaped portion 23a surrounding the periphery of the organic EL layer 32 in a frame shape, and an opening 23b where a region surrounded by the frame-shaped portion 23a is open.

In the manufacturing process of the organic EL display device 1, the protection film 23 is formed in such a manner as to cover the entire surface of the reflective film 22 to protect the reflective film 22 from UV light, a resist stripper, heat and the like, and then the formation region of the organic EL layer 32 is removed, thereby forming the opening 23b and the frame-shaped portion 23a, which is a region surrounding the opening 23b. The frame-shaped portion 23a of the protection film 23 is formed in a frame shape along the edge of the reflective film 22 in such a manner as to surround the periphery of the organic EL layer 32 on the reflective film 22.

The protection film 23 may be formed of a conductive material or an insulating material. The protection film 23 is preferably formed by using a material, such as ITO or indium zinc oxide (IZO), capable of being pattern-formed by the same etching solution as in the case of the conductive film 21. This is because the conductive film 21 and the protection film 23 can be simultaneously pattern-formed. As an example, in the present embodiment, the protection film 23 is formed of ITO.

The edge cover 31 is formed in a lattice pattern on the interlayer insulating film 14 in such a manner as to cover the edge of the reflective electrode 20. In the present embodiment, the edge cover 31 covers the frame-shaped portion 23a of the protection film 23.

The edge cover 31 is disposed between the pixels PIX adjacent to each other. In other words, the edge cover 31 serves as a partition between the pixels PIX adjacent to each other. The edge cover 31 prevents short-circuiting between the reflective electrode 20 and the transparent electrode 33 even in a case where the edge of the organic EL layer 32 is formed to be thin. By the edge cover 31 being provided, an electrical field concentration on the edge of the reflective electrode 20 is prevented. This makes it possible to prevent the deterioration of the organic EL layer 32. The edge cover 31 may include a photosensitive resin such as acrylic or polyimide.

As described below, the frame-shaped portion 23a is etched while using the edge cover 31 as a mask. With this, a side surface of the frame-shaped portion 23a in contact with the organic EL layer 32 and a side surface of the edge cover 31 in contact with the organic EL layer 32 constitute a continuous plane (in other words, the side surfaces are flush with each other to constitute an identical plane).

The organic EL layer 32 is formed in a region surrounded by the frame-shaped portion 23a of the protection film 23 and also in a region surrounded by the edge cover 31. The organic EL layer 32 is in contact with the inner wall of the frame-shaped portion 23a of the protection film 23 and the inner wall of the edge cover 31. Within the opening 23b of the protection film 23, a lower surface of the organic EL layer 32 (a surface on the TFT substrate 10 side) is in contact with the reflective film 22.

When the organic EL layer 32 is formed by an ink-jet method, the edge cover 31 functions as a bank that blocks a liquid material to become the organic EL layer 32.

The organic EL layer 32 may be formed by a vapor deposition method, an ink-jet method, or the like. The organic EL layer 32 has a configuration in which a hole injection layer, a hole transport layer, a light emitting layer, an electron transport layer, an electron injection layer, and the like are layered in that order from the reflective electrode 20 side, for example. Note that a single layer may have a plurality of functions. For example, in place of the hole injection layer and the hole transport layer, a hole injection-cum-transport layer having the functions of both these layers may be provided. In addition, in place of the electron injection layer and the electron transport layer, an electron injection-cum-transport layer having the functions of both these layers may be provided. In addition, a carrier blocking layer may be provided between each of the layers as appropriate.

As illustrated in FIG. 1, the transparent electrode 33 is formed on the entire surface of a display region 5 including the organic EL layer 32 and the edge cover 31. Note that the transparent electrodes 33 may be pattern-formed in an island shape for each pixel PIX. The transparent electrode 33 includes a transparent conductive material. The transparent electrode 33 may be constituted of ITO, IZO, or the like, as an example. In the present embodiment, the transparent electrode 33 is formed of ITO.

In addition, the wiring line 25 for distribution wiring made of the same material and has the same layer structure as those of the reflective electrode 20, is formed at a location other than a location within the pixel PIX. FIG. 1 illustrates an example in which the wiring line 25 is formed in a frame region 6 on the interlayer insulating film 14.

The wiring line 25 includes a conductive film (second conductive film) 26 formed on the interlayer insulating film 14, and a reflective film (second reflective film) 27 formed on the conductive film 26. The protection film 28 is formed on the wiring line 25 (that is, on the reflective film 27). The conductive film 26 is formed in the same layer as the conductive film 21 of the reflective electrode 20. The reflective film 27 is formed in the same layer as the reflective film 22 of the reflective electrode 20. The protection film 28 is formed in the same layer as the protection film 23.

The wiring line 25 is formed along with the formation of the reflective electrode 20. In other words, the conductive film 26 and the conductive film 21 are made of the same material and formed in the same manufacturing step, and the reflective film 27 and the reflective film 22 are made of the same material and formed in the same manufacturing step. Furthermore, the protection film 28 and the protection film 23 are made of the same material and formed in the same manufacturing step.

The wiring line 25 is a wiring line formed in the same layer as the reflective electrode 20. When viewed from a direction vertical to the substrate, the wiring line 25 is formed overlapping the wiring line 16 that is formed in the same layer as the TFT 12 in a region other than a region where the contact hole is formed. With this, the wiring line 25 is formed across the interlayer insulating film 14 having a thick film thickness, and therefore does not form unnecessary capacitance; in addition, an area of the light emitting region (region surrounded by the edge cover 31 and serving as the formation region of the organic EL layer 32) can be widened while keeping the wiring line resistance low.

The edge cover 31 also covers the protection film 28 on the wiring line 25.

The sealing layer 34 is formed on the transparent electrode 33, the edge cover 31, and the interlayer insulating film 14. The sealing layer 34 seals the entire surface of the display region 5 and the frame region 6. The sealing layer 34 performs thin film encapsulation (TFE) on the organic EL layer 32, so that the organic EL layer 32 is prevented from being deteriorated by moisture, oxygen, and the like infiltrated from outside.

As one example, the sealing layer 34 may have a triple-layer structure in which an inorganic layer, an organic layer, and an inorganic layer are layered in that order. Examples of a material for the organic layer include organic insulating materials (resin materials) such as a polysiloxane, silicon oxide carbide (SiOC), an acrylate, a polyurea, parylene, a polyimide, and a polyamide. Examples of a material for the inorganic layer include inorganic insulating materials such as silicon nitride, silicon oxide, silicon oxynitride, and $Al_2O_3$. Note that the structure of the sealing layer 34 is not limited to the triple-layer structure described above.

The present embodiment gives the description on the assumption that the reflective electrode 20 is an anode electrode (pattern electrode, pixel electrode) and the transparent electrode 33 is a cathode electrode (common electrode). However, the reflective electrode 20 may be a cathode electrode and the transparent electrode 33 may be an anode electrode. Note that in this case, the order of the layers constituting the organic EL layer 32 is reversed.

Furthermore, the present embodiment gives the description on the assumption that the organic EL display device 1 is a top-emitting type configured to emit light that has been emitted from the organic EL layer 32 to the outside from the sealing layer 34 side. However, in a case where the organic EL display device 1 is a bottom-emitting type configured to emit light that has been emitted from the organic EL layer 32 to the outside from a rear face side of the support body 11, the transparent electrode 33 has the same configuration as the configuration of the reflective electrode 20, and the reflective electrode 20 is constituted of a transparent electrode or semitransparent electrode made of a transparent or semitransparent light-transmissive electrode material.

Modification of Wiring Line 25

Figure 10:
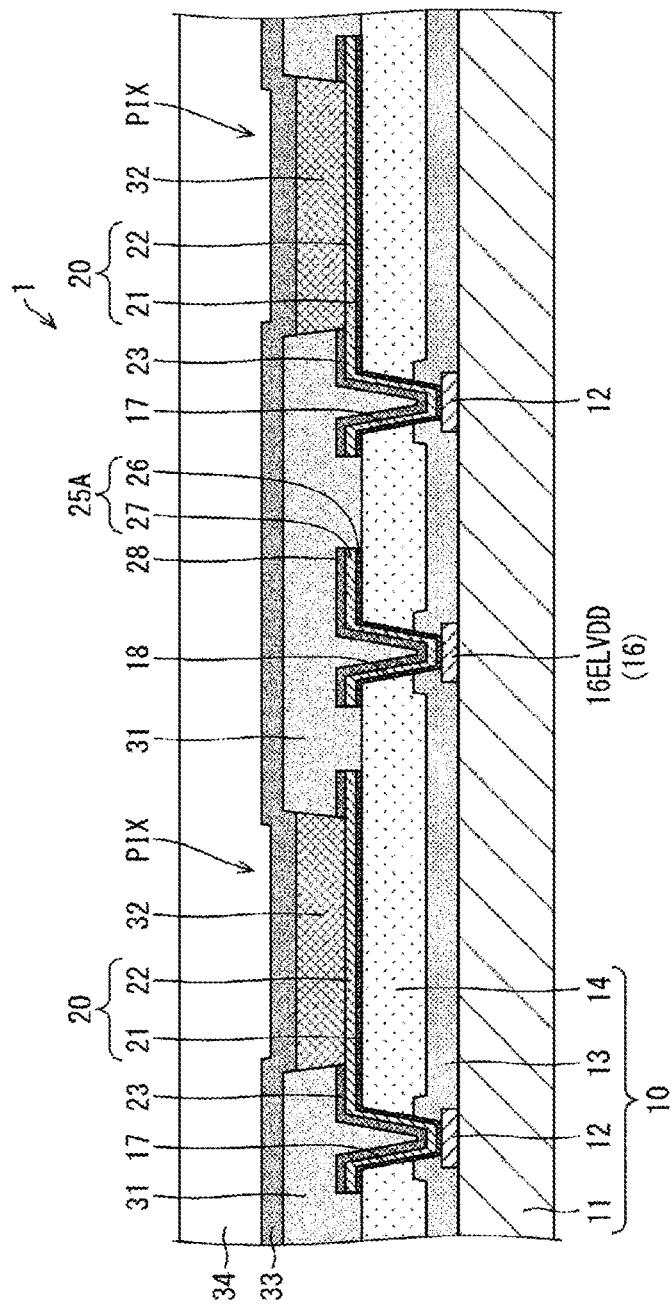
FIG. 10 is a view illustrating an example in which a wiring line is formed under the edge cover in the organic EL display device according to the first embodiment of the disclosure.
Figure 11:
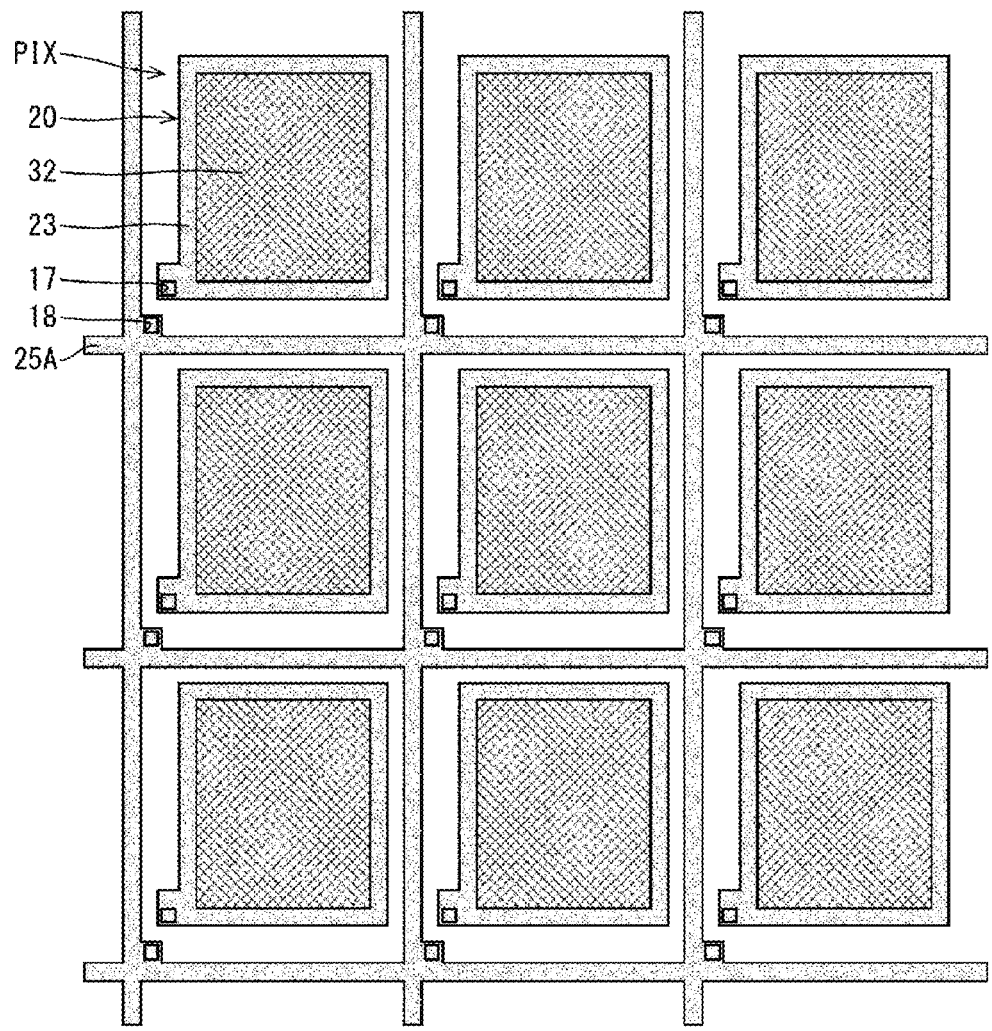
FIG. 11 is a plan view of a pixel of the organic EL display device illustrated in FIG. 10.

FIG. 10 is a view illustrating an example in which a wiring line is formed under the edge cover in the organic EL display device 1. FIG. 11 is a plan view of a pixel of the organic EL display device illustrated in FIG. 10.

The wiring line 25 illustrated in FIG. 1, like a wiring line 25A illustrated in FIG. 10, may be formed on an interlayer insulating film 14 between reflective electrodes 20 adjacent to each other. A protection film 28 is formed on the wiring line 25A, and an edge cover 31 covers the wiring line 25A and the protection film 28.

Like the wiring line 25A of this case, when the wiring line 25A is formed on the interlayer insulating film 14 between the reflective electrodes 20 adjacent to each other, it is preferable for the wiring line 25A to be connected to a high-level power source line.

A pixel circuit is provided in each pixel PIX in such a manner as to correspond to each of intersection points between a plurality of source wiring lines and a plurality of gate wiring lines formed in a display region of the organic EL display device 1.

Power source lines (not illustrated) common to each of the pixel circuits are disposed in the display region. To be more specific, a power source line which supplies a high-level power supply voltage ELVDD for driving the organic EL element (hereinafter, referred to as a "high-level power source line"), a power source line which supplies a low-level power supply voltage ELVSS for driving the organic EL element (hereinafter, referred to as a "low-level power source line"), and a power source line which supplies an initialization voltage Vini (hereinafter, referred to as an "initialization power source line") are disposed. The high-level power supply voltage ELVDD, the low-level power supply voltage ELVSS, and the initialization voltage Vini are supplied from a power source circuit (not illustrated). The above-mentioned pixel circuit will be described later with reference to FIG. 12.

As illustrated in FIG. 10, the wiring line 25A includes a conductive film (second conductive film) 26 formed on the interlayer insulating film 14, and a reflective film (second reflective film) 27 formed on the conductive film 26.

The wiring line 25A is formed between the organic EL elements adjacent to each other (between the reflective electrodes 20 adjacent to each other), and is covered by the edge cover 31.

As illustrated in FIG. 10 and FIG. 11, the wiring line 25A is connected to a high-level power source line 16ELVDD (wiring line 16) formed in the same layer as a TFT 12 via a contact hole 18 formed in the interlayer insulating film 14 and a passivation film 13.

The wiring line 25A is formed between pixels PIX (between the reflective electrodes 20) in such a manner as to surround the pixel PIX (reflective electrode 20). The wiring line 25A may be formed in a lattice pattern, may be formed only in the machine direction of the paper surface in FIG. 11, or may be formed in the left and right direction of the paper surface in FIG. 11.

It is preferable that the wiring line 25A be electrically connected, via the contact hole 18, particularly to the high-level power source line 16ELVDD (see FIG. 10). As a result, the resistance of the high-level power source line 16ELVDD, through which the largest amount of current flows, can be reduced.

As illustrated in FIG. 10, the conductive film 26, the reflective film 27, and a protection film 28 are layered and disposed in the contact hole 18. When the protection film 28 is formed of a conductive material, the film thickness of the protection film 28 is made thicker than the film thickness of the conductive film 26, thereby making it possible to reduce the resistance in and near the contact hole 18.

In addition, a contact hole 17 is formed in the interlayer insulating film 14 and the passivation film 13 under the reflective electrode 20 in a region covered by the edge cover 31. The reflective electrode 20 is electrically connected to the drain electrode of the TFT 12 via the contact hole 17. A conductive film 21, a reflective film 22, and a protection film 23 are layered and disposed in the contact hole 17. When the protection film 23 is formed of a conductive material, the film thickness of the protection film 23 is made thicker than the film thickness of the conductive film 21, thereby making it possible to reduce the resistance in and near the contact hole 17.

Manufacturing Method for Organic EL Display Device 1

Figure 3A:
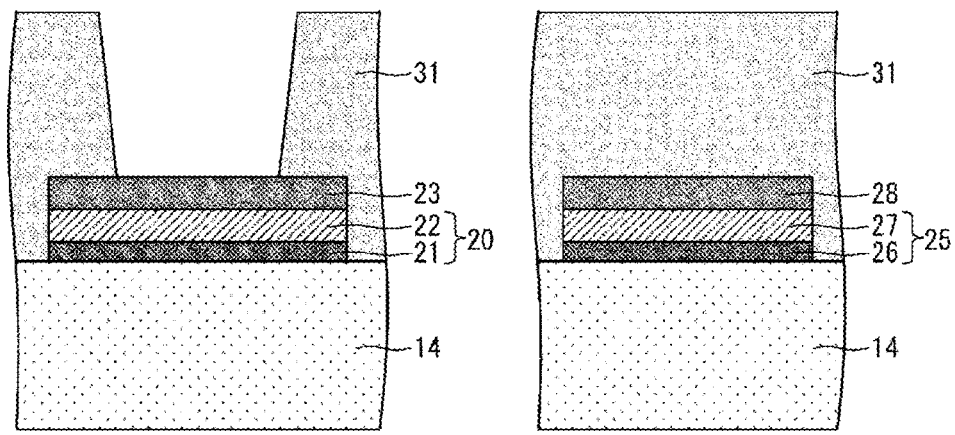
FIG. 3A is a cross-sectional view illustrating a reflective electrode and a protection film on the reflective electrode, and a wiring line and a protection film on the wiring line of the organic EL display device according to the first embodiment of the disclosure.
Figure 3B:
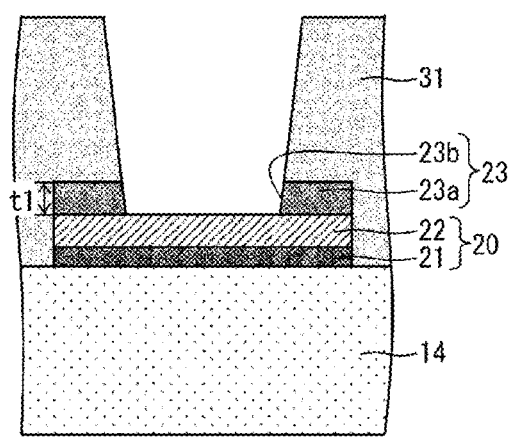
FIG. 3B is a cross-sectional view illustrating a state after etching the protection film on the reflective electrode.

Next, with reference to FIG. 1 and FIGS. 3A and 3B, a manufacturing method for the organic EL display device 1 will be described. FIG. 3A is a cross-sectional view illustrating a state of the reflective electrode 20 and the protection film 23 on the reflective electrode 20, and the wiring line 25 and the protection film 28 on the wiring line 25 of the organic EL display device 1 according to the first embodiment of the disclosure before performing etching, while FIG. 3B is a cross-sectional view illustrating a state thereof after etching the protection film 23 on the reflective electrode 20.

The TFT 12 and the wiring line 16 (various types of wiring lines such as the gate wiring line, source wiring line, and power source lines) are formed on the support body 11 using a known method. Subsequently, an inorganic insulating film including silicon nitride, silicon oxide, or the like is film-formed on the support body 11 by CVD or the like in such a manner as to cover the TFT 12 and the wiring line 16, whereby the passivation film 13 is formed.

Next, an organic material made of, for example, a photosensitive resin such as acrylic or polyimide is applied onto the passivation film 13, and film formation is performed by spin-coating or the like. Then, the interlayer insulating film 14 is formed by patterning the film-formed organic material by photolithography or the like. At this time, a contact hole is formed in the interlayer insulating film 14 and the passivation film 13 to expose part of the TFT 12.

Subsequently, ITO to become the conductive films 21, 26 is film-formed on the entire surface of the interlayer insulating film 14 by sputtering or the like to form a first ITO film (step of conductive film film-formation). The first ITO film is electrically connected to the drain electrode of the TFT 12 via the contact hole formed in the interlayer insulating film 14 and the passivation film 13.

Next, silver or a silver alloy to become the reflective films 22, 27 is film-formed on the entire surface of the first ITO film by sputtering or the like (step of reflective film film-formation).

Then, ITO to become the protection films 23, 28 is film-formed by sputtering or the like on the entire surface of the reflective films having been film-formed on the entire surface of the first ITO film in the above step of reflective film film-formation, thereby film-forming a second ITO film (step of protection film film-formation).

In this manner, the first ITO film, the reflective films, and the second ITO film are continuously film-formed on the entire surface of the substrate.

Next, a resist is applied on the second ITO film. Subsequently, photolithography is performed, and further the resist is patterned by dry etching in which an amine-based stripper of water-base or solvent-base is used.

UV cleaning is performed by irradiating the entire surface of the substrate with UV light immediately prior to performing photolithography at a time of patterning the resist. When the UV light is directly radiated on the reflective film made of silver or a silver alloy, the reflectivity of the reflective film is decreased. However, since the second ITO film made of ITO is formed on the reflective film in such a manner as to cover the entire surface of the reflective film, it is possible to protect the reflective film from the UV light.

Next, while using the patterned resist as an etching stopper, the first ITO film, the reflective films, and the second ITO film are collectively patterned in an island shape by wet etching using an etching solution of phosphoric acid-base, nitric acid-base or acetic acid-base, or the like.

As a result, in the formation region of the reflective electrode 20, the conductive film 21 is formed in an island shape (step of conductive film formation), and the reflective film 22 covering the entire surface of the conductive film 21 is formed in an island shape on the conductive film 21 (step of reflective film formation). With this, the reflective electrode 20 is formed (step of reflective electrode formation). In addition, on the reflective film 22 (on the reflective electrode 20), the protection film 23 covering the entire surface of the reflective film 22 is formed in an island shape (step of protection film formation).

Additionally, in the formation region of the wiring line 25, the wiring line 25 is formed in which the conductive film 26 and the reflective film 27 are layered. Furthermore, the protection film 28 is formed on the wiring line 25 (on the reflective film 27).

As discussed above, since the conductive films 21, 26 and the protection films 23, 28 are formed of the same material, three layers including the reflective films 22 and 27, the conductive films 21 and 26, and the protection films 23 and 28 may be collectively pattern-formed by one wet etching.

Then, the resist having been used for pattern-forming the conductive films 21 and 26, the reflective films 22 and 27, and the protection films 23 and 28 in the island shape is stripped.

Note that, even if the first ITO film, the reflective films, and the second ITO film are not collectively patterned in an island shape, the conductive films 21 and 26, the reflective films 22 and 27, and the protection films 23 and 28 may be pattern-formed in the island shape by performing etching separately. In this case, after the film formation of the second ITO film, a resist is applied onto the second ITO film, and the resist is patterned by photolithography and wet etching. Then, the protection films 23 and 28 are formed by patterning the second ITO film by wet etching while using the above patterned resist as an etching stopper. Next, the reflective films 22 and 27 are formed by patterning the reflective films by wet etching. Furthermore, the conductive films 21 and 26 are formed by patterning the first ITO film by wet etching. Then, the resist having been used for pattern-forming the conductive films 21 and 26, the reflective films 22 and 27, and the protection films 23 and 28 in the island shape is stripped.

Next, UV cleaning is performed by irradiating the entire surface of the substrate with UV light, prior to applying a coating material to become the edge cover 31. Note that, when the UV light is directly radiated onto the reflective films 22 and 27 made of silver or a silver alloy, the reflectivity of the reflective films 22 and 27 is decreased. However, the protection film 23 made of ITO is formed on the reflective film 22 in such a manner as to cover the entire surface of the reflective film 22, and the protection film 28 made of ITO is formed on the reflective film 27 in such a manner as to cover the entire surface of the reflective film 27. This makes it possible to protect the reflective films 22 and 27 from UV light.

After the UV cleaning is performed, a resin film made of a photosensitive material to become the edge cover 31 is film-formed. Subsequently, the resin film is patterned by photolithography. With this, the edge cover 31 is formed. As a result, the edge cover 31 is formed in a lattice pattern to cover the edges of the reflective electrodes 20 and protection films 23 formed being aligned in a matrix shape (step of edge cover formation). The edge cover 31 is so formed as to cover the entire surface of the wiring line 25 and the protection film 28.

In a case where a developing solution used at the time of patterning the edge cover 31 makes direct contact with the reflective films 22 and 27, the reflective films 22 and 27 are deteriorated. However, the protection film 23 made of ITO is formed on the reflective film 22 in such a manner as to cover the entire surface of the reflective film 22, and the protection film 28 made of ITO is formed on the reflective film 27 in such a manner as to cover the entire surface of the reflective film 27. This makes it possible to protect the reflective films 22 and 27 from the developing solution when the edge cover 31 is formed.

As illustrated in FIG. 3A, when the edge cover 31 is formed, the protection film 23 is exposed in a region surrounded by the edge cover 31 (a region serving as the formation region of the organic EL layer 32 and also the light emitting region). On the other hand, an opening is not formed in a region of the edge cover 31 covering the protection film 28, so that the protection film 28 is not exposed.

Next, wet etching is performed using an oxalic acid-based etching solution or the like. In the wet etching, as illustrated in FIG. 3B, the protection film 23 within the region surrounded by the edge cover 31 is removed while using the edge cover 31 as a mask.

As a result, the opening 23b is formed in the region of the protection film 23 surrounded by the edge cover 31. In other words, the frame-shaped portion 23a surrounding the opening 23b is formed (step of protection film processing). In this manner, the frame-shaped portion 23a is formed in a frame shape along the edge of the reflective film 22.

Since the protection film 28 on the wiring line 25 is covered by the edge cover 31, the protection film 28 on the wiring line 25 is not removed by the wet etching.

When ITO becomes polycrystalline from an amorphous state, the ITO cannot be removed by wet etching using an oxalic acid-based etching solution or the like generally used as an etching solution of ITO.

Therefore, it is preferable to use amorphous ITO for the protection film 23.

In a case where ITO is equal to or smaller than 15 nm in thickness, it does not crystallize from an amorphous state even when annealed at an elevated temperature such as 200° C. or higher. Therefore, it is preferable for a film thickness t1 of the frame-shaped portion 23a of the protection film 23 to be equal to or smaller than 15 nm. With this, the protection film 23 may be formed by wet etching using an oxalic acid-based etching solution or the like generally used as an etching solution of ITO.

In a case where the film thickness of the protection film 23 is too thin, the protection film 23 does not function as a protection film of the reflective film 22. Therefore, it is preferable for the film thickness t1 of the frame-shaped portion 23a of the protection film 23 to be equal to or greater than 10 nm. This makes it possible for the protection film 23 to sufficiently function as a protection film of the reflective film 22. In the case where the film thickness t1 of the protection film 23 is equal to or greater than 10 nm and equal to or smaller than 15 nm, the film thickness of the protection film 28 as well is similarly equal to or greater than 10 nm and equal to or smaller than 15 nm. Note that when the protection films 23 and 28 are formed of a conductive material, the film thickness of the protection films 23 and 28 is made thicker than the film thickness of the conductive films 21 and 26. This makes it possible to decrease the resistance of the reflective electrode 20 and the wiring line 25.

Then, the etching solution having been used for pattern-forming the protection film 23 is washed away by water rinsing. Next, the substrate is baked at a temperature of approximately 200° C. to evaporate water droplets adhering to the substrate.

As discussed above, because the protection film 23 is pattern-formed by wet etching while using the edge cover 31 as a mask, it is unnecessary to separately prepare a mask for pattern-forming the protection film 23.

Subsequently, the organic EL layer 32 is pattern-formed in the region surround by the edge cover 31 by separate coating deposition or the like. Because the protection film 23 is removed in the region surrounded by the edge cover 31, the organic EL layer 32 and the reflective film 22 make contact with each other.

The transparent electrode 33 is formed on the organic EL layer 32 and the edge cover 31 across the entire surface of the display region 5 by vapor deposition or the like.

Subsequently, the sealing layer 34 is formed. Specifically, a first inorganic layer made of silicon nitride, silicon oxide, or the like is formed by CVD or the like in such a manner as to cover the transparent electrode 33, the edge cover 31, and the interlayer insulating film 14. Then, an organic layer is formed on the above inorganic layer across the entire surface of the display region 5 by an ink-jet method or the like. Next, a second inorganic layer made of silicon nitride, silicon oxide, or the like is formed on the above organic and inorganic layers by CVD or the like. As a result, the sealing layer 34 is formed.

After then, a drive circuit and the like are connected, to complete the organic EL display device 1. Note that, after the sealing layer 34 is formed, the support body 11 may be changed from a glass substrate to a film, to make the organic EL display device 1 flexible in a bendable manner.

The wiring line 25A illustrated in FIG. 10 and FIG. 11 can also be formed similarly to the wiring line 25.

Main Effect

As described above, the protection film 23 on the reflective electrode 20 includes the frame-shaped portion 23a formed in a frame shape along the edge of the reflective electrode 20. This makes it possible to have a configuration in which the organic EL layer 32 and the reflective electrode 20 make contact with each other within the opening 23b surrounded by the frame-shaped portion 23a of the protection film 23 formed in the frame shape. As a result, light directed from the organic EL layer 32 in the direction of the reflective electrode 20 does not pass through the protection film 23, is reflected directly by the reflective film 22, passes through the organic EL layer 32, the transparent electrode 33 and the sealing layer 34, and is emitted to the outside of the organic EL display device 1. Because of this, it is possible to prevent a reduction in the reflectivity of the reflective electrode 20.

The protection film 23 covers the entire surface of the reflective film 22 before the opening 23b is formed. Due to this, it is possible to protect the reflective film 22, in the manufacturing process of the organic EL display device 1 after the formation of the reflective film 22, from the factors that may cause the deterioration in quality of the reflective film 22, such as UV light used at the UV cleaning before the application of the coating material to become the edge cover 31, and an etching solution used at the time of pattern-forming the edge cover 31.

In addition, the reflective films 22 and 27 can be protected from the UV cleaning and resist stripping in the step of patterning the protection films 23 and 28, the reflective films 22 and 27, and the conductive films 21 and 26, and a temperature at which the edge cover 31 is heated when being fired (approximately 250° C. to approximately 350° C. as an example).

The opening 23b of the protection film 23 is removed while using the edge cover 31 as a mask. Therefore, the frame-shaped portion 23a surrounding the opening 23b is covered by the edge cover 31. Since the opening 23b of the protection film 23 is formed while using the edge cover 31 as a mask in the manner described above, it is unnecessary to separately provide a mask or the like in order to form the opening 23b.

Between the protection film 23 and the reflective film 22, a transparent conductive film (etching stopper layer) may be provided having a thinner thickness than that of the frame-shaped portion 23a of the protection film 23, and being less likely to be etched (having etching tolerability) than the protection film 23 by the etching solution used when the protection film 23 is pattern-formed. Examples of the transparent conductive film (etching stopper layer) include polycrystalline ITO having a film thickness of approximately 3 nm. This makes it possible to more reliably protect the reflective film 22 from the etching solution when forming the opening 23b in the protection film 23.

The transparent conductive film (etching stopper layer) pattern-forms ITO in a polycrystalline state. In this case, when the ITO in the polycrystalline state is pattern-formed by wet etching, a typical oxalic acid-based etching solution may not be used, and an etching solution such as a mixed solution of hydrochloric acid and ferric chloride is used.

Second Embodiment

Figure 4:
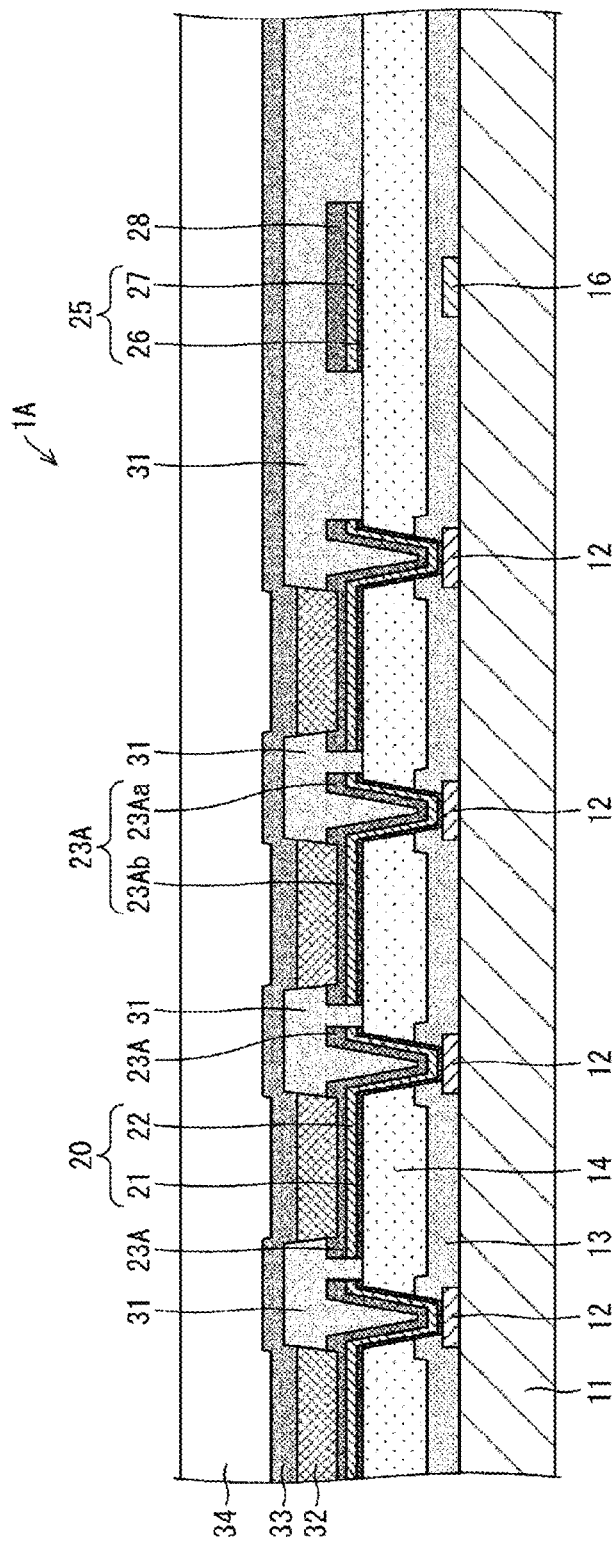
FIG. 4 is a cross-sectional view illustrating a configuration of an organic EL display device according to a second embodiment of the disclosure.
Figure 5A:
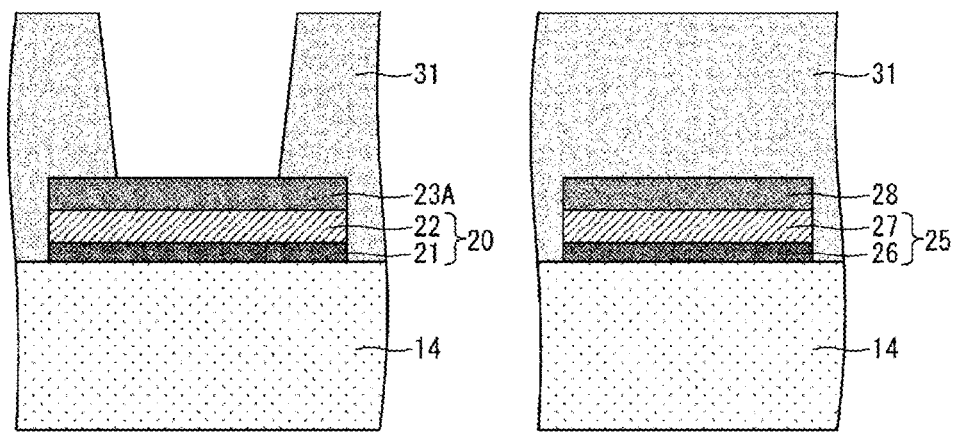
FIG. 5A is a cross-sectional view illustrating a reflective electrode and a protection film on the reflective electrode, and a wiring line and a protection film on the wiring line of the organic EL display device according to the second embodiment of the disclosure.
Figure 5B:
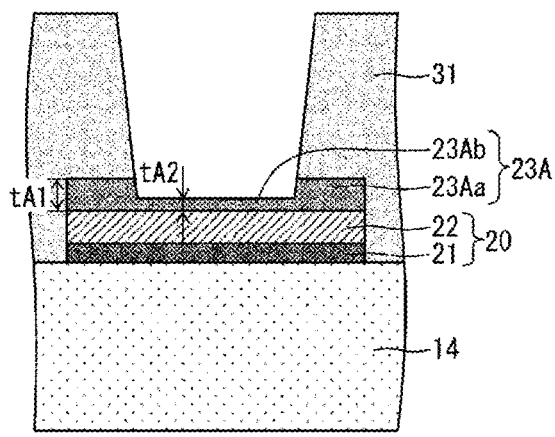
FIG. 5B is a cross-sectional view illustrating a state after etching the protection film on the reflective electrode.

A following description is regarding the second embodiment of the disclosure, with reference to FIG. 4 and FIGS. 5A and 5B. Note that for convenience of description, members having the same function as the members stated in the first embodiment are appended with the same reference symbols, with the description thereof omitted. FIG. 4 is a cross-sectional view illustrating the configuration of an organic EL display device 1A according to the second embodiment of the disclosure.

The organic EL display device 1A includes a protection film (first protection film) 23A in place of the protection film 23 included in the organic EL display device 1 (see FIG. 1). Other configurations of the organic EL display device 1A are the same as those of the organic EL display device 1.

The protection film 23A includes a frame-shaped portion 23Aa surrounding the periphery of an organic EL layer 32 in a frame shape, and a thin film portion 23Ab having a thinner film thickness than the frame-shaped portion 23Aa in a region surrounded by the frame-shaped portion 23Aa. In other words, the protection film 23A includes a recessed portion surrounded by the frame-shaped portion 23Aa and covers the entire surface of a reflective film 22.

The protection film 23A may be formed of a transparent conductive material such as ITO or IZO. As an example, in the present embodiment, the protection film 23A is formed of ITO.

Next, with reference to FIG. 4 and FIGS. 5A and 5B, a manufacturing method for the organic EL display device 1A will be described.

FIG. 5A is a cross-sectional view illustrating a reflective electrode and a protection film on the reflective electrode, and a wiring line and a protection film on the wiring line of the organic EL display device 1A according to the second embodiment of the disclosure, and FIG. 5B is a cross-sectional view illustrating a state after etching the protection film on the reflective electrode.

The manufacturing method for the organic EL display device 1A is the same as that for the organic EL display device 1 from the beginning step to the step of edge cover formation (see FIG. 1 and FIGS. 3A and 3B).

In the step of edge cover formation, an edge cover 31 of a lattice pattern is formed covering the edges of reflective electrodes 20 and the protection films 23A that are formed being aligned in a matrix shape.

As illustrated in FIG. 5A, when the edge cover 31 is formed, the protection film 23A is exposed in a region surrounded by the edge cover 31 (a formation region of the organic EL layer 32). On the other hand, the edge cover 31 covers a protection film 28, so that the protection film 28 is not exposed.

Next, wet etching is performed using an oxalic acid-based etching solution or the like. In the wet etching, as illustrated in FIG. 5B, the film thickness of the protection film 23A in the region surrounded by the edge cover 31 is thinned while using the edge cover 31 as a mask.

The concentration of the etching solution, the etching time, and the like are adjusted so that the protection film 23A in the region surrounded by the edge cover 31 has a thinned film thickness without being completely removed.

As a result, the thin film portion 23Ab having a thinned film thickness is formed in the region of the protection film 23A surrounded by the edge cover 31. In other words, the frame-shaped portion 23Aa surrounding the thin film portion 23Ab is formed (step of protection film processing). As discussed above, the frame-shaped portion 23Aa is formed in a frame shape along the edge of the reflective film 22, and the thin film portion 23Ab is formed in the region surrounded by the frame-shaped portion 23Aa.

Since the protection film 28 on a wiring line 25 is covered by the edge cover 31, the protection film 28 on the wiring line 25 is not removed by the wet etching.

Then, the etching solution having been used for pattern-forming the protection film 23A is washed away by water rinsing. Next, the substrate is baked at a temperature of approximately 200° C. to evaporate water droplets adhering to the substrate.

In a case where the reflective film 22 is constituted of pure silver rather than a silver alloy, the reflectivity thereof may decrease during the baking. However, in the present embodiment, the reflective film 22 is not exposed, and the entire surface thereof is covered by the protection film 23A. Because of this, it is possible to prevent a reduction in reflectivity of the reflective film 22.

After this, similarly to the organic EL display device 1 (FIG. 1 and FIGS. 3A and 3B), the organic EL display device 1A is completed by sequentially forming the organic EL layer 32, a transparent electrode 33, a sealing layer 34, and the like.

The protection film 23A is preferably constituted of amorphous ITO. This is because the wet etching can be performed using an oxalic acid-based etching solution or the like generally used as an etching solution of ITO. By setting a film thickness tA1 of the frame-shaped portion 23Aa to equal to or smaller than 15 nm, an amorphous state can be maintained without becoming polycrystalline even when heat is applied thereto.

By setting a film thickness tA2 of the thin film portion 23Ab to equal to or smaller than approximately 3 nm, even when light emitted from the organic EL layer 32 passes through the thin film portion 23Ab, and the light reflected by the reflective film 22 passes through the thin film portion 23Ab again and is emitted to the outside of the organic EL display device 1A, a drop in the amount of light can be suppressed.

Furthermore, according to the organic EL display device 1A, because the protection film 23A covers the entire surface of the reflective film 22, it is possible to more reliably protect the reflective film 22 from the factors that may degrade the quality of the reflective film 22 in the manufacturing process of the organic EL display device 1A after having formed the reflective film 22.

In other words, it is possible both to suppress a drop in the amount of light from the organic EL layer 32 and to achieve a more reliable protection of the reflective film 22.

Third Embodiment

Figure 6:
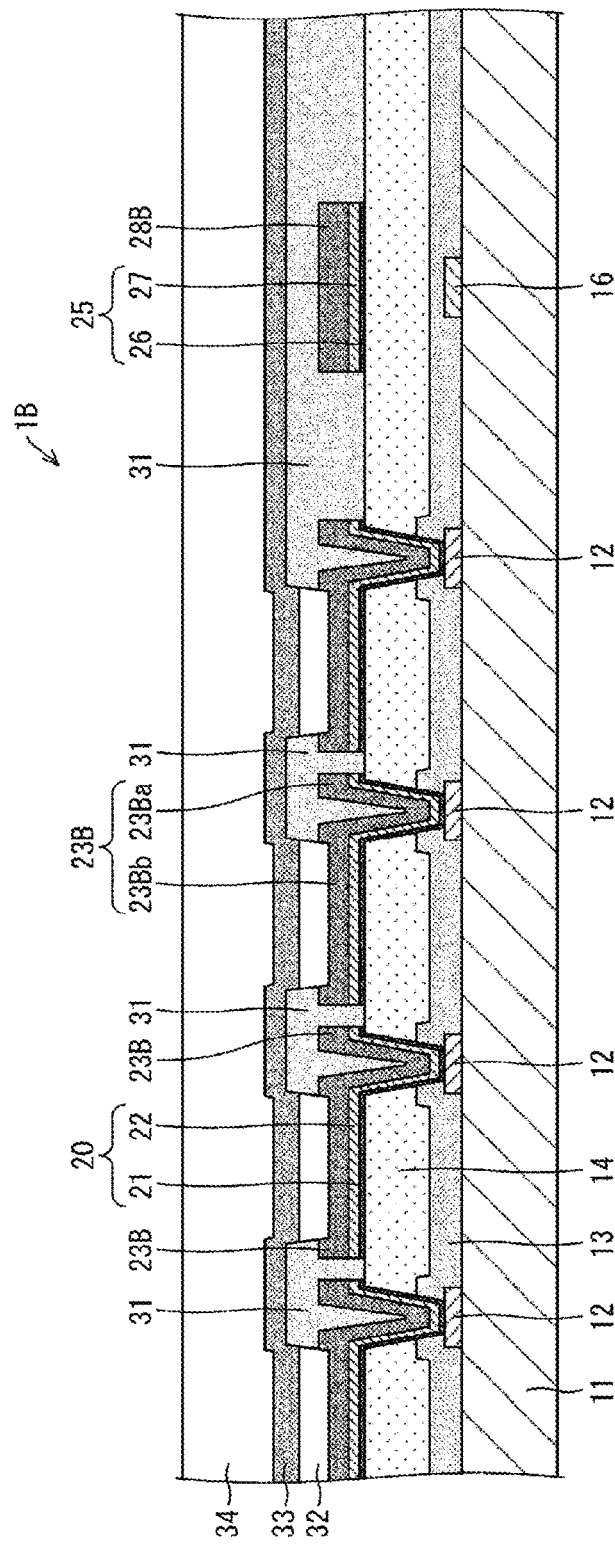
FIG. 6 is a cross-sectional view illustrating a configuration of an organic EL display device according to a third embodiment of the disclosure.

A third embodiment of the disclosure will be described below with reference to FIG. 6 and FIGS. 7A and 7B. Note that for convenience of description, members having the same functions as the members stated in the first and second embodiments are appended with the same reference symbols, with the description thereof omitted. FIG. 6 is a cross-sectional view illustrating a configuration of an organic EL display device 1B according to the third embodiment of the disclosure.

The organic EL display device 1B has a configuration in which the protection film 23A included in the organic EL display device 1A (see FIG. 4) is replaced with a protection film (first protection film) 23B, and the protection film 28 included therein is replaced with a protection film (second protection film) 28B. Other configurations of the organic EL display device 1B are the same as those of the organic EL display device 1A.

The protection film 23B includes a frame-shaped portion 23Ba surrounding the periphery of an organic EL layer 32 in a frame shape, and a thin film portion 23Bb having a thinner film thickness than the frame-shaped portion 23Ba in a region surrounded by the frame-shaped portion 23Ba. In other words, the protection film 23B includes a recessed portion surrounded by the frame-shaped portion 23Ba and covers the entire surface of a reflective film 22.

The protection film 23B may be constituted of a transparent conductive material, such as IZO, that does not become polycrystalline even when heat is applied thereto. As an example, in the present embodiment, the protection film 23B is formed of IZO. The protection film 28B is also formed of the same material as the protection film 23B.

Next, with reference to FIG. 6 and FIGS. 7A and 7B, a manufacturing method for the organic EL display device 1B will be described.

Figure 7A:
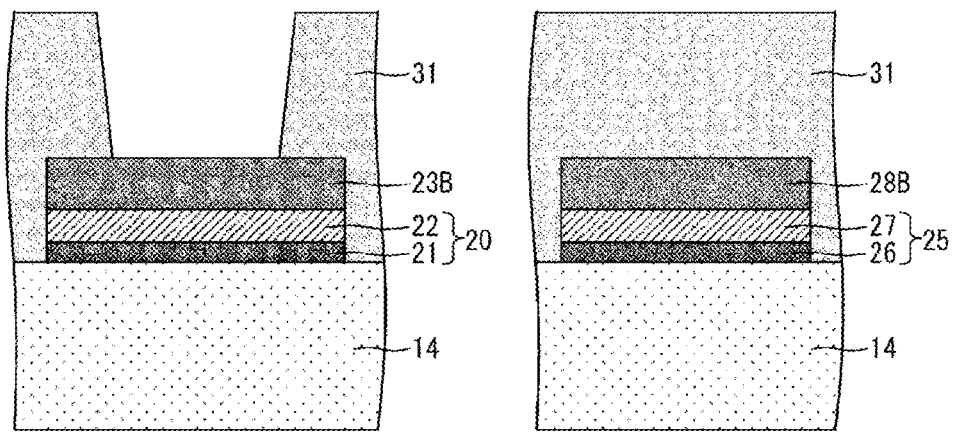
FIG. 7A is a cross-sectional view illustrating a reflective electrode and a protection film on the reflective electrode, and a wiring line and a protection film on the wiring line of the organic EL display device according to the third embodiment of the disclosure.
Figure 7B:
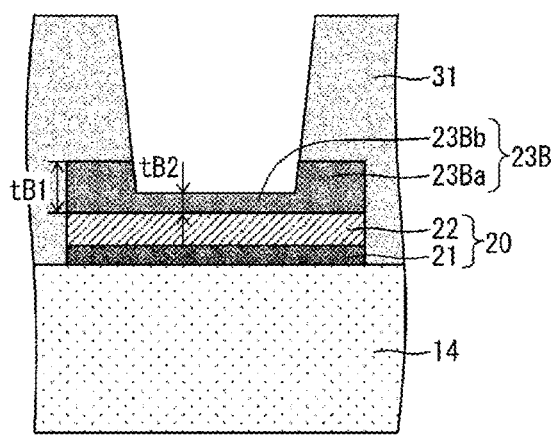
FIG. 7B is a cross-sectional view illustrating a state after etching the protection film on the reflective electrode.

FIG. 7A is a cross-sectional view illustrating a reflective electrode and a protection film on the reflective electrode, and a wiring line and a protection film on the wiring line of the organic EL display device 1B according to the third embodiment of the disclosure, and FIG. 7B is a cross-sectional view illustrating a state after etching the protection film on the reflective electrode.

The manufacturing method for the organic EL display device 1B is the same as that for the organic EL display device 1 (see FIG. 1 and FIGS. 3A and 3B) and for the organic EL display device 1A (see FIG. 4 and FIGS. 5A and 5B) from the beginning step to the step of reflective film film-formation.

In the step of reflective film film-formation, silver or a silver alloy to become reflective films 22 and 27 is film-formed on a first ITO film to become conductive films 21 and 26 across the entire surface of the first ITO film by sputtering or the like.

Further, IZO to become the protection films 23B and 28B is film-formed, by sputtering or the like, on the entire surface of the reflective films having been film-formed on the entire surface of the first ITO film in the above-mentioned step of reflective film film-formation, thereby forming an IZO film.

Next, the first ITO film, the reflective films, and the IZO film are collectively pattern-formed in an island shape by wet etching using an oxalic acid-based etching solution or the like.

As a result, in the formation region of a reflective electrode 20, the conductive film 21 is formed in an island shape (step of conductive film formation), and the reflective film 22 covering the entire surface of the conductive film 21 is formed in an island shape on the conductive film 21 (step of reflective film formation). With this, the reflective electrode 20 is formed (step of reflective electrode formation). In addition, on the reflective film 22 (on the reflective electrode 20), the protection film 23B covering the entire surface of the reflective film 22 is formed in an island shape (step of protection film formation).

Additionally, in the formation region of the wiring line 25, the wiring line 25 is formed in which the conductive film 26 and the reflective film 27 are layered. Furthermore, the protection film 28B is formed on the wiring line 25 (on the reflective film 27).

As discussed above, since the conductive films 21, 26 and the protection films 23B, 28B are formed of a material capable of being etched by the same oxalic acid-based etching solution, three layers including the reflective films 22 and 27, the conductive films 21 and 26, and the protection films 23B and 28B may be collectively pattern-formed by one wet etching.

Next, in a step of edge cover formation, an edge cover 31 of a lattice pattern is formed covering the edges of each of the protection films 23B that are formed being aligned in a matrix shape.

As illustrated in FIG. 7A, when the edge cover 31 is formed, the protection film 23B is exposed in a region surrounded by the edge cover 31 (the formation region of the organic EL layer 32). On the other hand, the edge cover 31 covers the protection film 28B, so that the protection film 28B is not exposed.

Next, wet etching is performed using an oxalic acid-based etching solution or the like. In the wet etching, as illustrated in FIG. 7B, the film thickness of the protection film 23B in the region surrounded by the edge cover 31 is thinned while using the edge cover 31 as a mask.

As a result, the thin film portion 23Bb having a thinned film thickness is formed in a region of the protection film 23B surrounded by the edge cover 31. In other words, the frame-shaped portion 23Ba surrounding the thin film portion 23Bb is formed (step of protection film processing). As discussed above, the frame-shaped portion 23Ba is formed in a frame shape along the edge of the reflective film 22, and the thin film portion 23Bb is formed in the region surrounded by the frame-shaped portion 23Ba.

Since the protection film 28B on the wiring line 25 is covered by the edge cover 31, the protection film 28B on the wiring line 25 is not removed by the wet etching.

Then, the etching solution having been used for pattern-forming the protection film 23B is washed away by water rinsing. Next, the substrate is baked at a temperature of approximately 200° C. to evaporate water droplets adhering to the substrate.

IZO is different from ITO in a sense that IZO does not become polycrystalline by heat even if the film thickness thereof is thick. A film thickness tB1 of the frame-shaped portion 23Ba may be greater than 15 nm. In other words, it is sufficient that the film thickness tB1 of the frame-shaped portion 23Ba is thicker than a film thickness tB2 of the thin film portion 23Bb. Since the protection film 23B can be made to be in an amorphous state, the wet etching can be performed using an oxalic acid-based etching solution or the like generally used as an etching solution of ITO and IZO. Because of this, it is not required to prepare a special etching solution.

By setting the film thickness tB2 of the thin film portion 23Bb to equal to or smaller than approximately 3 nm, even when light emitted from the organic EL layer 32 passes through the thin film portion 23Bb, and the light reflected by the reflective film 22 passes through the thin film portion 23Bb again and is emitted to the outside of the organic EL display device 1B, a drop in the amount of light can be suppressed.

After this, similarly to the organic EL display device 1 (FIG. 1 and FIGS. 3A and 3B) and the organic EL display device 1A (FIG. 4 and FIGS. 5A and 5B), the organic EL display device 1B is completed by sequentially forming the organic EL layer 32, a transparent electrode 33, a sealing layer 34, and the like.

Fourth Embodiment

Figure 8:
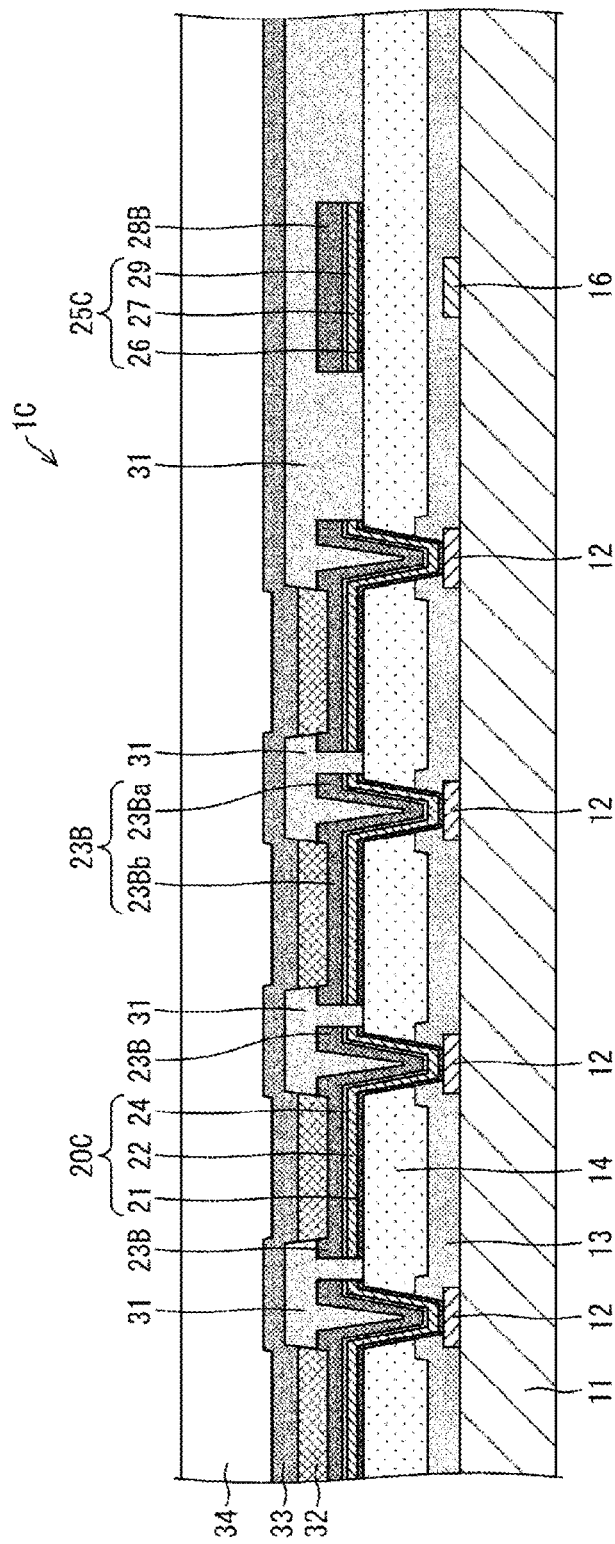
FIG. 8 is a cross-sectional view illustrating a configuration of an organic EL display device according to a fourth embodiment of the disclosure.

A fourth embodiment of the disclosure will be described below with reference to FIG. 8 and FIGS. 9A and 9B. Note that for the convenience of description, members having the same functions as the functions of the members described in the first to third embodiments are denoted by the same reference signs, and description of such members will be omitted. FIG. 8 is a cross-sectional view illustrating a configuration of an organic EL display device 1C according to the fourth embodiment of the disclosure.

The organic EL display device 1C includes a reflective electrode 20C and a wiring line (second wiring line) 25C in place of the reflective electrode 20 and the wiring line 25 included in the organic EL display device 1B (see FIG. 6).

The reflective electrode 20C has a configuration in which an etching stopper layer (first etching stopper layer) 24 is formed on a reflective film 22. A protection film 23B is formed on the etching stopper layer 24. The wiring line 25C has a configuration in which an etching stopper layer (second etching stopper layer) 29 is formed on a reflective film 27. A protection film 28B is formed on the etching stopper layer 29. Other configurations of the organic EL display device 1C are the same as those of the organic EL display device 1B.

The etching stopper layers 24 and 29 are transparent conductive films each having a thinner film thickness than a frame-shaped portion 23Ba, and being less likely to be etched (having etching tolerability) than the protection films 23B and 28B by an etching solution used when pattern-forming the protection films 23B and 28B. The etching stopper layers 24 and 29 may be formed of, for example, ITO that is made polycrystalline (hereinafter, referred to as polycrystalline ITO) and has a film thickness of equal to or smaller than approximately 3 nm.

Since the etching stopper layer 29 made of a conductive material is formed in the wiring line 25C, the wiring line 25C can be made to have low resistance compared with a case where the etching stopper layer 29 is not formed therein.

Next, with reference to FIG. 8 and FIGS. 9A and 9B, a manufacturing method for the organic EL display device 1C will be described.

Figure 9A:
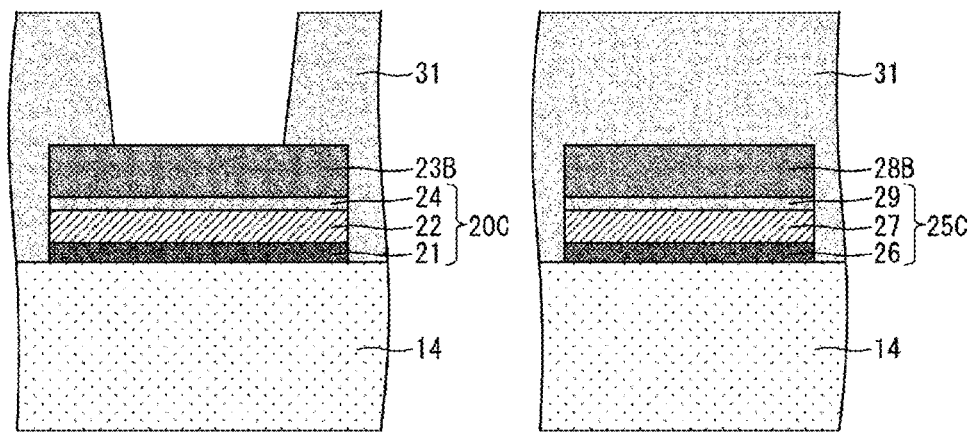
FIG. 9A is a cross-sectional view illustrating a reflective electrode and a protection film on the reflective electrode, and a wiring line and a protection film on the wiring line of the organic EL display device according to the fourth embodiment of the disclosure.
Figure 9B:
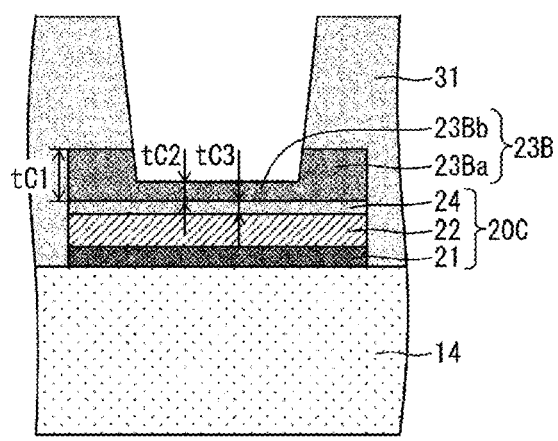
FIG. 9B is a cross-sectional view illustrating a state after etching the protection film on the reflective electrode.

FIG. 9A is a cross-sectional view illustrating a reflective electrode and a protection film on the reflective electrode, and a wiring line and a protection film on the wiring line of the organic EL display device 1C according to the fourth embodiment of the disclosure, and FIG. 9B is a cross-sectional view illustrating a state after etching the protection film on the reflective electrode.

The manufacturing method for the organic EL display device 1C is the same as that for the organic EL display device 1 (see FIG. 1 and FIGS. 3A and 3B) from the beginning step to the step of reflective film film-formation.

In the step of reflective film film-formation, silver or a silver alloy to become the reflective films 22 and 27 is film-formed on the entire surface of a first ITO film by sputtering or the like.

Further, polycrystalline ITO to become the etching stopper layer 24 is film-formed, by sputtering or the like, on the entire surface of the reflective films having been film-formed on the entire surface of the first ITO film in the step of reflective film film-formation, thereby forming a third ITO film.

Next, IZO to become the protection films 23B and 28B is film-formed on the third ITO film by sputtering or the like so as to form an IZO film.

Subsequently, a resist is film-formed on the IZO film, and the resist is patterned by photolithography and wet etching.

Next, the IZO film is pattern-formed in an island shape by wet etching using an oxalic acid-based etching solution or the like. With this, the protection film 23B is formed in an island shape in the formation region of the reflective electrode 20C (step of protection film formation). Furthermore, the protection film 28B is formed in the formation region of the wiring line 25C.

Next, the polycrystalline third ITO film is pattern-formed by wet etching using an etching solution such as a mixed solution of hydrochloric acid and ferric chloride. As a result, the etching stopper layer 24 is formed in an island shape in the formation region of the reflective electrode 20C (step of etching stopper layer formation). In addition, the etching stopper layer 29 is formed in the formation region of the wiring line 25C.

Next, the reflective film and the first ITO film are patterned by wet etching using an oxalic acid-based etching solution or the like. As a result, the reflective film 22 and a conductive film 21 are pattern-formed in the formation region of the reflective electrode 20C (steps of reflective film formation and conductive film formation). In addition, the reflective film 27 and a conductive film 26 are formed in the formation region of the wiring line 25C. Then, the resist is stripped.

Next, in a step of edge cover formation, an edge cover 31 of a lattice pattern is formed covering the edges of each of the protection films 23B that are formed being aligned in a matrix shape.

As illustrated in FIG. 9A, when the edge cover 31 is formed, the protection film 23B is exposed in a region surrounded by the edge cover 31 (the formation region of an organic EL layer 32). On the other hand, the edge cover 31 covers the protection film 28B on the wiring line 25C, so that the protection film 28B is not exposed.

Next, wet etching is performed using an oxalic acid-based etching solution or the like. In the wet etching, as illustrated in FIG. 9B, the film thickness of the protection film 23B in the region surrounded by the edge cover 31 is thinned while using the edge cover 31 as a mask.

As a result, a thin film portion 23Bb having a thinned film thickness is formed in a region of the protection film 23B surrounded by the edge cover 31. In other words, the frame-shaped portion 23Ba surrounding the thin film portion 23Bb is formed (step of protection film processing). As discussed above, the frame-shaped portion 23Ba is formed in a frame shape along the edge of the reflective film 22, and the thin film portion 23Bb is formed in the region surrounded by the frame-shaped portion 23Ba, on the reflective film with the etching stopper layer 24 interposed therebetween.

Since the protection film 28C is covered by the edge cover 31, the protection film 28B on the wiring line 25C is not removed by the wet etching.

Between the protection film 23B and the reflective film 22, there is formed the etching stopper layer 24 formed of ITO that is unlikely to be etched by the oxalic acid-based etching solution used when the protection film 23B is pattern-formed. Due to this, in the step of protection film processing, the reflective film 22 can be protected from the etching solution even when the whole thin film portion 23Bb is removed.

Therefore, it is possible to more reliably prevent a reduction in reflectivity of the reflective film 22.

A film thickness tC1 of the frame-shaped portion 23Ba may be greater than 15 nm. That is, it is sufficient that the film thickness tC1 of the frame-shaped portion 23Ba is thicker than a film thickness tC2 of the thin film portion 23Bb.

It is preferable for the film thickness tC2 of the thin film portion 23Bb to be equal to or smaller than 3 nm. It is preferable for a film thickness tC3 of the etching stopper layer 24 to be equal to or smaller than 3 nm. As a result, even when light emitted from the organic EL layer 32 passes through the thin film portion 23Bb and the etching stopper layer 24, and the light reflected by the reflective film 22 passes through the thin film portion 23Bb and etching stopper layer 24 again and is emitted to the outside of the organic EL display device 1C, a drop in the amount of light may be suppressed. Therefore, it is possible both to suppress the drop in the amount of light and to more reliably protect the reflective film 22 from the etching solution.

After this, similarly to the organic EL display device 1 (FIG. 1 and FIGS. 3A and 3B), the organic EL display device 1A (FIG. 4 and FIGS. 5A and 5B), and the organic EL display device 1B (FIG. 6 and FIGS. 7A and 7B), the organic EL display device 1C is completed by sequentially forming the organic EL layer 32, a transparent electrode 33, a sealing layer 34, and the like.

Fifth Embodiment

Figure 12:
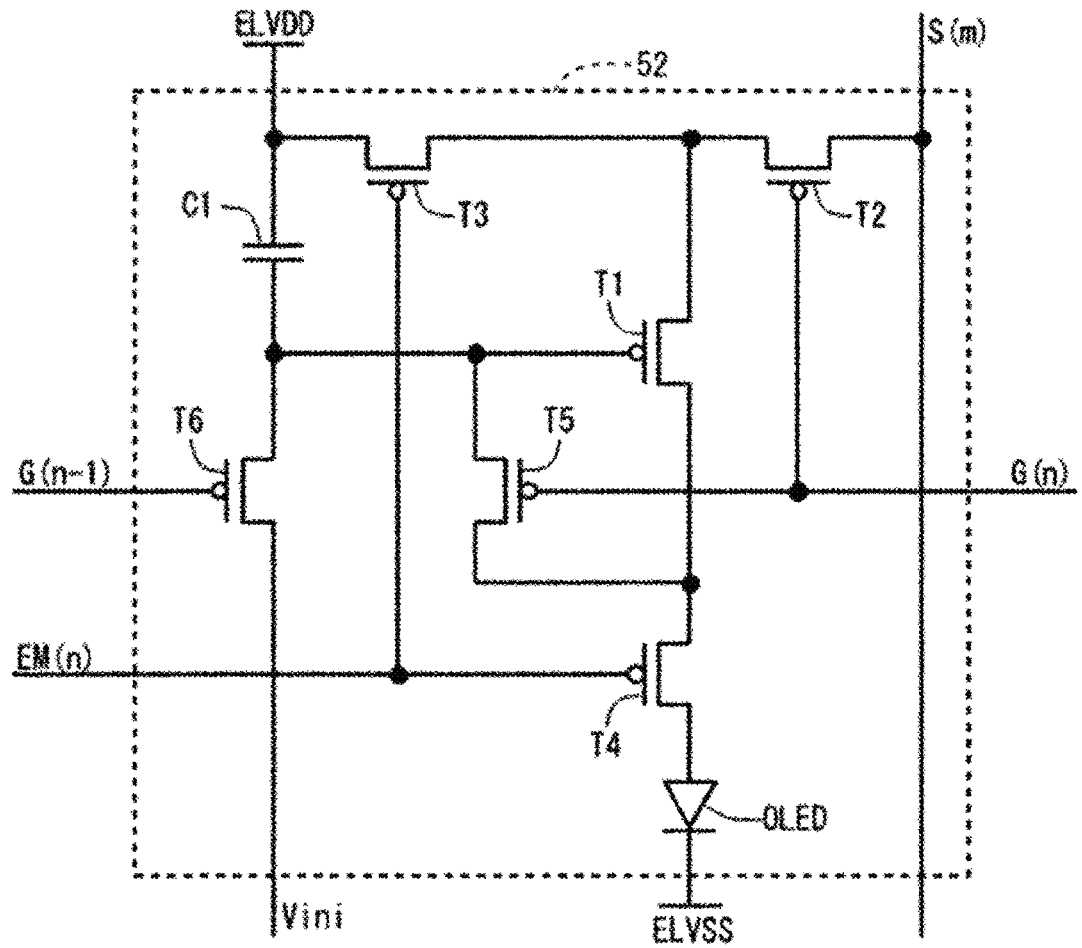
FIG. 12 is a diagram illustrating a configuration of a pixel circuit of an organic EL display device according to a fifth embodiment of the disclosure.
Figure 13:
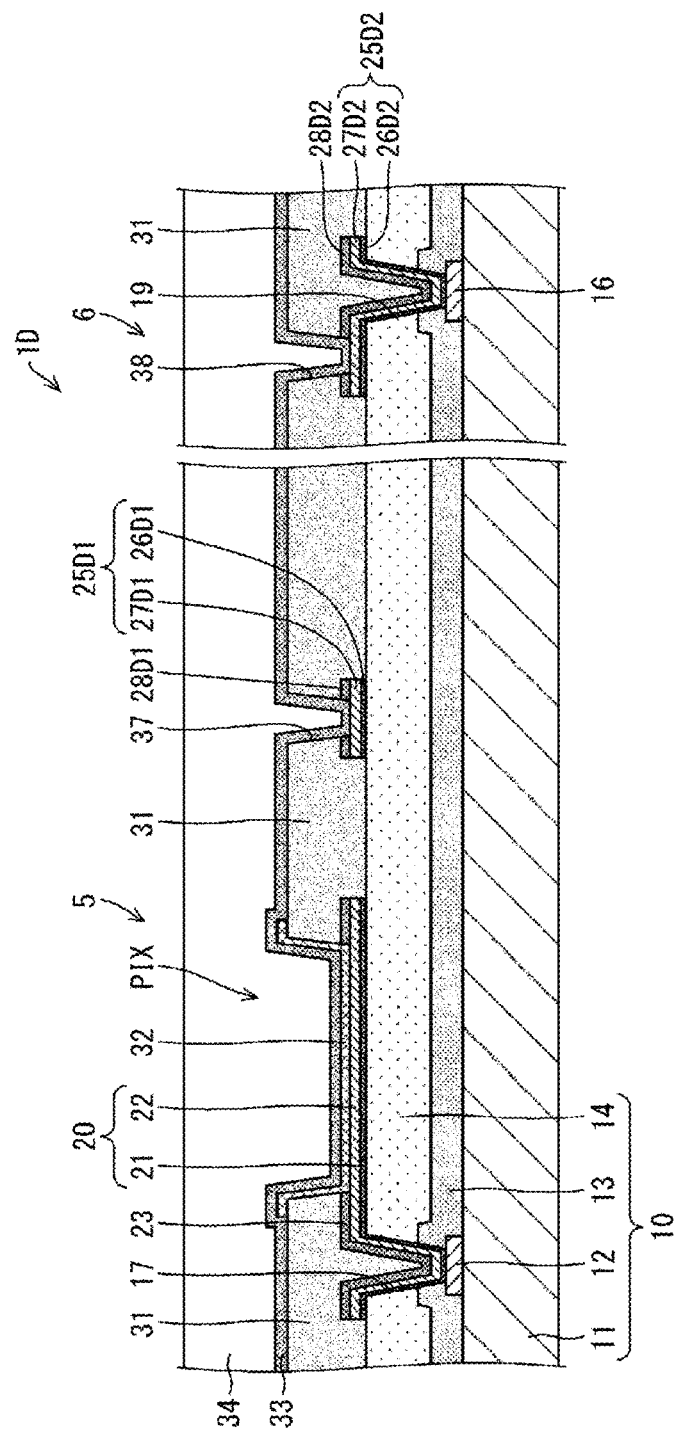
FIG. 13 is a cross-sectional view of a pixel of the organic EL display device according to the fifth embodiment of the disclosure.
Figure 14:
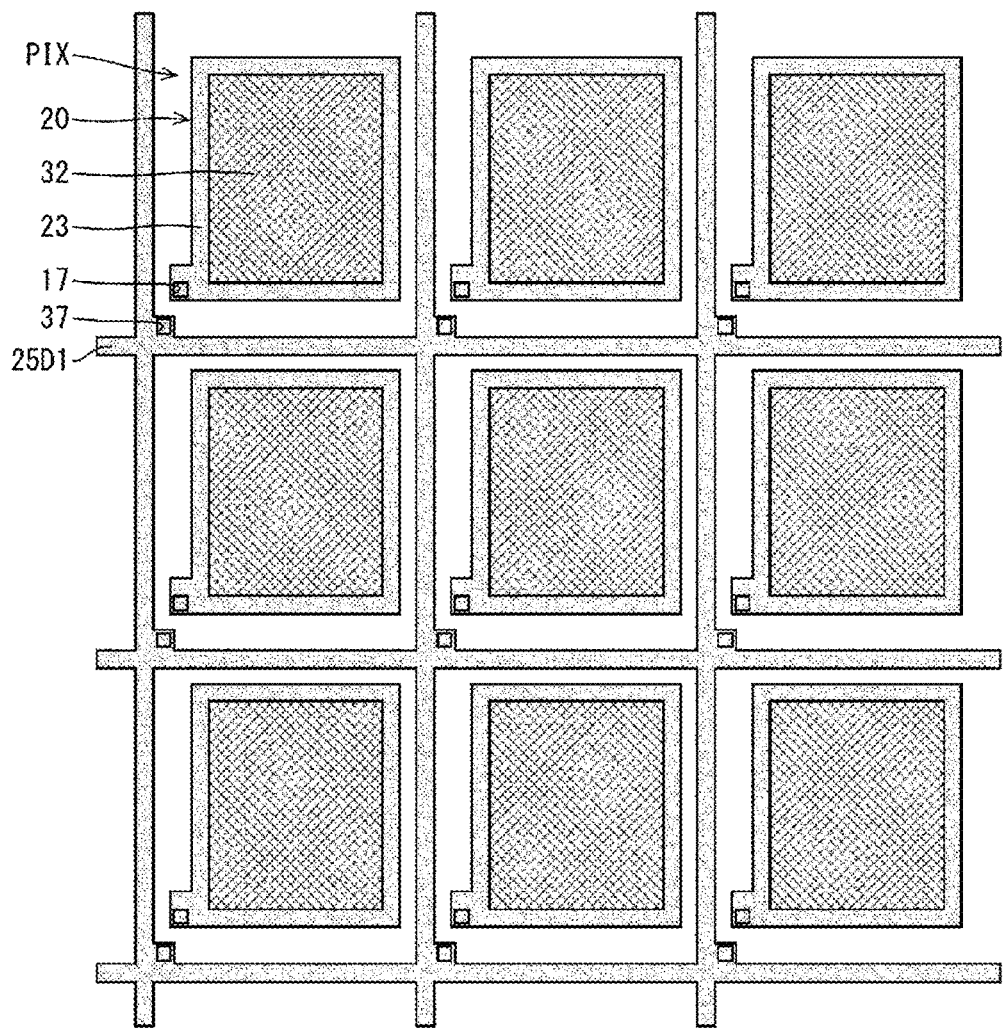
FIG. 14 is a plan view of a pixel of the organic EL display device according to the fifth embodiment of the disclosure.

A description follows regarding a fifth embodiment of the disclosure, with reference to FIG. 12 to FIG. 14. Note that for the convenience of description, members having the same functions as the functions of the members described in the first to fourth embodiments are denoted by the same reference signs, and description of such members will be omitted.

FIG. 12 is a diagram illustrating a configuration of a pixel circuit of an organic EL display device 1D according to the fifth embodiment of the disclosure. FIG. 12 illustrates a configuration of a pixel circuit 52 corresponding to m columns and n rows. Note that the configuration of the pixel circuit 52 described here is merely one example, and another known configuration can be employed instead.

A plurality of source wiring lines S(m) and a plurality of gate wiring lines G(n) orthogonal to each other are arranged in a display region of the organic EL display device 1D. Further, a plurality of light emission control wiring lines EM(n) are arranged to correspond to the plurality of gate wiring lines on a one-to-one basis in the display region. Furthermore, the pixel circuits 52 are provided to correspond to intersections of the plurality of source wiring lines S(m) and the plurality of gate wiring lines G(n) in the display region. The pixel circuits 52 are provided as described above, whereby a plurality of pixels are formed in a matrix shape in the display region.

Power source lines (not illustrated) common to each of the pixel circuits 52 are disposed in the display region. More specifically, a high-level power source line that supplies a high-level power supply voltage ELVDD to an organic EL element, a low-level power source line that supplies a low-level power supply voltage ELVSS to the organic EL element, and an initialization power source line that supplies an initialization voltage Vini are disposed.

The high-level power supply voltage ELVDD is supplied to a first electrode (anode electrode) formed under an organic EL layer 32, and the low-level power supply voltage ELVSS is supplied to a second electrode (cathode electrode) formed on the organic EL layer 32. In the case of a top-emitting type organic EL display device, the first electrode also serves as a reflective electrode.

Each of the pixel circuits 52 includes one organic EL element OLED, six transistors T1 to T6 (a drive transistor T1, a writing control transistor T2, a power supply control transistor T3, a light emission control transistor T4, a threshold voltage compensation transistor T5, and an initialization transistor T6), and one capacitor C1. The transistors T1 to T6 are p-channel transistors. The capacitor C1 is a capacitative element including two electrodes (first electrode and second electrode).

FIG. 13 is a cross-sectional view of a pixel of the organic EL display device 1D according to the fifth embodiment of the disclosure. FIG. 14 is a plan view of a pixel of the organic EL display device 1D according to the fifth embodiment of the disclosure.

As illustrated in FIG. 13, in the organic EL display device 1D, a wiring line (second wiring line) 25D1 and a wiring line (third wiring line) 25D2 are formed in the same layer as a reflective electrode 20 (on an interlayer insulating film 14). In addition, in the same layer as a protection film 23 (on the wiring line 25D1), a protection film (second protection film) 28D1 is formed on the wiring line 25D1, and a protection film (third protection film) 28D2 is formed on the wiring line 25D2. The wiring line 25D1 includes a conductive film (second conductive film) 26D1 formed on the interlayer insulating film 14, and a reflective film (second reflective film) 27D1 formed on the conductive film 26D1. The wiring line 25D2 includes a conductive film (third conductive film) 26D2 formed on the interlayer insulating film 14, and a reflective film (third reflective film) 27D2 formed on the conductive film 26D2. The wiring lines 25D1 and 25D2, and the protection films 28D1 and 28D2 may be formed similarly to the wiring lines 25 and 25C, and the protection films 28 and 28B described in the first to fourth embodiments.

In other words, the conductive film 26D1 and the conductive film 26D2 are formed in the same layer as a conductive film 21, and the reflective film 27D1 and the reflective film 27D2 are formed in the same layer as a reflective film 22.

The wiring line 25D1 is formed in a display region 5. The wiring line 25D1 is disposed adjacent to the organic EL display element (reflective electrode 20), and extends along the organic EL display elements (reflective electrodes 20) disposed side by side. The wiring line 25D1 is formed on an outer side relative to the organic EL display element (reflective electrode 20) formed on the outer side among the organic EL display elements (reflective electrodes 20) formed in the display region 5. The wiring line 25D1 is also formed between the organic EL elements adjacent to each other (between the reflective electrodes 20 adjacent to each other). In the present embodiment, the wiring line 25D1 may be formed in a lattice pattern.

The wiring line 25D2 is not formed in the display region 5, but is formed in a frame region 6.

The wiring lines 25D1 and 25D2 are covered by an edge cover 31. A contact hole 37 is formed on the wiring line 25D1 in the edge cover 31. A contact hole 38 is formed on the wiring line 25D2 in the edge cover 31.

A transparent electrode 33 on the edge cover 31 is connected to the wiring line 25D1 via the contact hole 37, and is also connected to the wiring line 25D2 via the contact hole 38.

As a result, the transparent electrode 33 and the wiring lines 25D1 and 25D2 can be electrically connected.

Note that in a case where the protection films 28D1 and 28D2 on the wiring lines 25D1 and 25D2 are constituted by an insulating material, it is necessary that the protection films 28D1 and 28D2 are completely removed in the contact holes 37 and 38, and that the transparent electrode 33 and the wiring lines 25D1, 25D2 are brought into direct contact with each other. On the other hand, in a case where the protection films 28D1 and 28D2 are constituted by a conductive material, the transparent electrode 33 and the wiring lines 25D1, 25D2 may be connected via the protection films 28D1 and 28D2 in the contact holes 37 and 38.

Further, the wiring line 25D2 is connected to a wiring line 16 formed in the same layer as a TFT 12 via a contact hole 19 formed in the interlayer insulating film 14 and a passivation film 13. Not in the display region 5 but in the frame region 6, the wiring line 25D2 is connected, via the contact hole 19, to the wiring line 16 formed in the same layer as the TFT 12. The conductive film 26D2, the reflective film 27D2, and the protection film 28D2 are layered and disposed in the contact hole 19. When the protection films 28D1 and 28D2 are formed of a conductive material, the film thickness of the protection films 28D1 and 28D2 is made thicker than the film thickness of the conductive films 26D1 and 26D2, thereby making it possible to reduce the resistance in and near the contact holes 37 and 38.

In this manner, via the wiring line 25D2, the transparent electrode 33 is connected to the wiring line 16 in the same layer as the TFT 12. Because the wiring line 25D2 disposed in the contact hole 19 includes two layers of the conductive film 26D2 and the reflective film 27D2, the resistance in and near the contact hole 19 can be reduced compared with a case in which the transparent electrode 33 is directly connected to the wiring line 16.

When the protection film 28D2 on the wiring line 25D2 is formed of a conductive material, it is preferable that the film thickness of the protection film 28D2 be made thicker than the film thickness of the conductive film 26D2 of the wiring line 25D2. With this, the resistance between the transparent electrode 33 and the wiring line 25D2 connected via the protection film 28D2 may be lowered.

As illustrated in FIG. 14, the wiring line 25D1 is formed between pixels PIX (between the reflective electrodes 20) in such a manner as to surround the pixel PIX (reflective electrode 20). The wiring line 25D1 may be formed in a lattice pattern, may be formed only in the longitudinal direction of the paper surface, or may be formed in the left and right direction of the paper surface. A contact hole 17 is formed in the formation region of the reflective electrode 20. The contact hole 37 is formed in the formation region of the wiring line 25D1.

It is preferable that the wiring lines 25D1 and 25D2 be electrically connected to a low-level power source line in particular. This makes it possible to lower the resistance of the second electrode (the cathode, that is, the transparent electrode 33) having high resistance, in which a large current flows.

Although, in FIG. 13 and FIG. 14, it is illustrated that the transparent electrode 33 is electrically connected to the wiring line 25D1 via the contact hole 37 for each pixel PIX, the transparent electrode 33 may be electrically connected to the wiring line 25D1 for a plurality of pixels PIX each.

Supplement

The organic EL display devices 1 and 1A according to an aspect 1 of the disclosure includes an organic EL layer 32, a reflective electrode 20 including a first reflective film (a reflective film 22), a transparent electrode 33 disposed opposite to the reflective electrode 20 with the organic EL layer 32 interposed between the reflective electrode 20 and the transparent electrode 33, and a first protection film (protection films 23, 23A, 23B) disposed on the reflective electrode 20 and arranged between the reflective electrode 20 and the organic EL layer 32. Further, the first protection film (protection films 23, 23A, 23B) includes a frame-shaped portion 23a surrounding the periphery of the organic EL layer 32 in a frame shape, and an opening 23b surrounded by the frame-shaped portion 23a or a thin film portion 23Ab surrounded by the frame-shaped portion 23a and having a film thickness thinner than a film thickness of the frame-shaped portion 23a.

According to the configuration described above, the organic EL layer and the first reflective film may be configured to make contact with each other or configured to be disposed with another layer interposed therebetween in the opening surrounded by the frame-shaped portion formed in a frame shape.

As a result, light directed from the organic EL layer in the direction of the reflective electrode does not pass through the first protection film, is reflected by the reflective film directly or through another layer, passes through the organic EL layer, the transparent electrode and the sealing layer, and is emitted to the outside of the organic EL display device. Because of this, it is possible to prevent a reduction in the reflectivity of the reflective electrode.

Alternatively, the organic EL layer and the reflective film may be configured such that they are disposed with the thin film portion interposed therebetween in the region surrounded by the frame-shaped portion formed in the frame shape.

With this, light directed from the organic EL layer in the direction of the reflective electrode passes through the thin film portion having a thinner film thickness than the frame-shaped portion, is reflected by the reflective film, passes through the thin film portion again, then passes through the organic EL layer, the transparent electrode and the sealing layer, and is emitted to the outside of the organic EL display device. Because of this, it is possible to suppress a reduction in the reflectivity of the reflective electrode.

The first protection film may be configured to cover the entire surface of the first reflective film before the opening is formed. Due to this, it is possible to protect the reflective electrode, in the manufacturing process of the organic EL display device after the formation of the first reflective film, from the factors that may cause the deterioration in quality of the reflective electrode, such as UV light used in UV cleaning before the application of a coating material to become the edge cover, and an etching solution used at the time of pattern-forming the edge cover.

The organic EL display device 1 according to an aspect 2 of the disclosure may be such that, in the aspect 1, the first protection film (protection film 23) includes an opening 23b where a region surrounded by the frame-shaped portion 23a is open, and the organic EL layer 32 is in contact with the first reflective film (reflective film 22) within the opening 23b of the first protection film (protection film 23).

According to the above configuration, light directed from the organic EL layer toward the direction of the reflective electrode does not pass through the first protection film, is directly reflected by the first reflective film, then passes through the organic EL layer, the transparent electrode and the sealing layer, and is emitted to the outside of the organic EL display device. Because of this, it is possible to prevent a reduction in the reflectivity of the reflective electrode.

The organic EL display devices 1 and 1A according to an aspect 3 of the disclosure may be such that, in the aspect 1 and aspect 2, the organic EL display devices 1 and 1A further include an edge cover 31 of a lattice pattern covering edges of the reflective electrodes 20 and 20A formed being aligned in a matrix shape, and the frame-shaped portions 23a and 23Aa are covered by the edge cover 31.

According to the configuration described above, the opening or thin film portion of the protection film may be formed while using the edge cover as a mask. Because of this, it is unnecessary to separately provide a mask or the like in order to form the opening or thin film portion.

The organic EL display devices 1 to 1C according to an aspect 4 of the disclosure may be such that, in the aspect 1 to aspect 3, a side surface of the edge cover 31 in contact with the organic EL layer 32 and a side surface of each of the frame-shaped portions 23a, 23Aa, and 23Ba in contact with the organic EL layer 32 constitute a continuous plane.

The organic EL display device 1C according to an aspect 5 of the disclosure may be such that, in the aspect 1 to aspect 4, the reflective electrode 20C further includes a first etching stopper layer (etching stopper layer 24), and the first etching stopper layer (etching stopper layer 24) is formed between the first reflective film (reflective film 22) and the first protection film (protection film 23B), and is formed of a material having a higher etching tolerability against an etching solution used at a time of pattern-forming the first protection film (protection film 23B) than a material of the first protection film (protection film 23B). According to the configuration described above, when etching the protection film, the reflective film can be reliably protected from the etching solution.

The organic EL display device 1 according to an aspect 6 of the disclosure may be such that, in the aspect 1 to aspect 5, the reflective electrode 20 includes a first conductive film (conductive film 21) disposed on the opposite side of the first reflective film (reflective film 22) to a side thereof on which the organic EL layer 32 is disposed, and the first protection film (protection film 23) has a film thickness thicker than a film thickness of the first conductive film (conductive film 21). According to the configuration described above, the resistance of the reflective electrode can be lowered.

The organic EL display device 1D according to an aspect 7 of the disclosure may be such that, in the aspect 6, it includes a switching element (TFT 12) for pixel driving disposed for each pixel PIX, a first wiring line (wiring line 16) formed in a layer identical to the layer of the switching element (TFT 12), and insulating films (passivation film 13, interlayer insulating film 14) which cover the switching element (TFT 12) and the first wiring line (wiring line 16) and on which the reflective electrode 20 is layered. Further, an organic EL element OLED disposed for each pixel PIX and including the reflective electrode 20, the transparent electrode 33, and films between the reflective electrode 20 and the transparent electrode 33, is connected to the first wiring line (wiring line 16) via a contact hole 19 formed in the above insulating films (passivation film 13, interlayer insulating film 14). In the contact hole 19, a second conductive film (conductive film 26D2) formed in a layer identical to the layer of the first conductive film (conductive film 21), a second reflective film (reflective film 27D2) formed in a layer identical to the layer of the first reflective film (reflective film 22), and a second protection film (protection film 28D2) formed in a layer identical to the layer of the first protection film (protection film 23) are layered and disposed. The second protection film (protection film 28D2) has a film thickness thicker than a film thickness of the second conductive film (conductive film 26D2). This makes it possible to lower a resistance value within and near the contact hole 19.

The organic EL display device 1D according to an aspect 8 of the disclosure may be such that, in the aspect 3 or 4, it includes insulating films (passivation film 13, interlayer insulating film 14) on which the reflective electrode 20 is layered, a second wiring line (wiring lines 25D1, 25D2) including the reflective electrode 20, the transparent electrode 33 and films between the reflective electrode 20 and the transparent electrode 33, and disposed on the above insulating films (passivation film 13, interlayer insulating film 14), and a second protection film (protection films 28D1, 28D2) disposed on the second wiring line (wiring lines 25D1, 25D2) and formed in a layer identical to the layer of the first protection film (protection film 23). The second wiring line (wiring lines 25D1, 25D2) includes a second reflective film (reflective films 27D1, 27D2) formed in a layer identical to the layer of the first reflective film (reflective film 22), and a second conductive film (26D1, 26D2) formed in a layer identical to the layer of the first conductive film 23.

The organic EL display devices 1 and 1D according to an aspect 9 of the disclosure may be such that, in the aspect 8, the second wiring line (wiring lines 25D1, 25D2) is electrically connected to a first wiring line (wiring lines 16, 16ELVDD) formed in the lower layer of the insulating films (passivation film 13, interlayer insulating film 14) via contact holes 17, 19 formed in the insulating films (passivation film 13, interlayer insulating film 14). This makes it possible to electrically connect the second wiring line and the first wiring line formed in different layers from each other.

The organic EL display device 1D according to an aspect 10 of the disclosure may be such that, in the aspect 9, the first wiring line (wiring line 16ELVDD) is a high-level power source line 16ELVDD configured to supply a high-level power supply voltage ELVDD to the reflective electrode 20. As a result, the resistance of the high-level power source line 16ELVDD can be suppressed.

The organic EL display device 1 according to an aspect 11 of the disclosure may be such that, in the aspect 8 or 9, the second wiring line (wiring line 25A) is formed between the reflective electrodes 20 adjacent to each other.

The organic EL display device 1D according to an aspect 12 of the disclosure may be such that, in the aspect 9 or 10, it includes a third wiring line (wiring line 25D2) disposed on the insulating films (passivation film 13, interlayer insulating film 14), and a third protection film (protection film 28D2) disposed on the third wiring line (wiring line 25D2) and formed in a layer identical to the layer of the first protection film (protection film 23). The third wiring line (wiring line 25D2) includes a third reflective film (reflective film 27D2) formed in a layer identical to the layer of the first reflective film (reflective film 22), and a third conductive film (conductive film 26D2) formed in a layer identical to the layer of the first conductive film (conductive film 21). The third wiring line (wiring line 25D2) is not formed in a display region 5 where the pixels PIX are formed in a matrix shape but is formed in a frame region 6 surrounding the display region 5, and is electrically connected to the first wiring line (wiring line 16) via the contact hole 38 in the frame region 6.

The organic EL display device 1D according to an aspect 13 of the disclosure may be such that, in the aspect 12, the transparent electrode 33 is also formed on the edge cover 31, and the transparent electrode 33 is connected to the second wiring line (wiring line 25D1) and the third wiring line (wiring line 25D2) via the contact holes 37 and 38 formed in the edge cover 31. According to the above configuration, the transparent electrode can be electrically connected to the second wiring line and the third wiring line, where the layer of the transparent electrode and the layer of the second and third wiring lines are different from each other.

Additionally, when the third wiring line is also connected to the first wiring line, the transparent electrode may be electrically connected to the first wiring line via the third wiring line. With this, the resistance may be suppressed compared with a case where the transparent electrode and the first wiring line are electrically connected directly.

The organic EL display device 1D according to an aspect 14 of the disclosure may be such that, in the aspect 8, the second wiring line (wiring lines 25D, 25D1, 25D2) includes the second conductive film (conductive films 26, 26D1, 26D2) formed in a layer identical to the layer of the first conductive film (conductive film 21), and the second protection film (protection films 28, 28D1, 28D2) has a film thickness thicker than a film thickness of the second conductive film (conductive films 26, 26D1, 26D2).

The organic EL display device 1C according to an aspect 15 of the disclosure may be such that, in the aspect 8 or 9, it includes a second wiring line (wiring line 25C) formed in a layer identical to the layer of the reflective electrode 20, and a second protection film (protection film 28B) formed in a layer identical to the layer of the first protection film (protection film 23). The second wiring line (wiring line 25C) includes a second conductive film (conductive film 26) formed in a layer identical to the layer of the first conductive film (conductive film 21), a second reflective film (reflective film 27) formed in a layer identical to the layer of the first reflective film (reflective film 22), and a second etching stopper layer (etching stopper layer 29) formed in a layer identical to the layer of the first etching stopper layer (etching stopper layer 24).

The organic EL display device 1C according to an aspect 16 of the disclosure may be such that, in the aspect 5, it includes a second wiring line (wiring line 25C) formed in a layer identical to the layer of the reflective electrode 20, and a second protection film (protection film 28B) formed in a layer identical to the layer of the first protection film (protection film 23). The reflective electrode 20C includes a first conductive film 21 disposed on the opposite side of the first reflective film 22 to a side thereof on which the organic EL layer 32 is disposed. The second wiring line (wiring line 25C) includes a second conductive film (conductive film 26) formed in a layer identical to the layer of the first conductive film (conductive film 21), a second reflective film (reflective film 27) formed in a layer identical to the layer of the first reflective film (reflective film 22), and a second etching stopper layer (etching stopper layer 29) formed in a layer identical to the layer of the first etching stopper layer (etching stopper layer 24).

The organic EL display device 1 according to an aspect 17 of the disclosure may be such that, in the aspects 7, 9, 10, 12 and 15, the first wiring line is formed in a lattice pattern in the periphery of the reflective electrode.

The organic EL display device 1 according to an aspect 18 of the disclosure may be such that, in the aspects 1 to 17, a low-level power supply voltage is supplied to the transparent electrode.

The organic EL display device 1 according to an aspect 19 of the disclosure may be such that, in the aspects 1 to 18, the first protection film 23 is formed of ITO.

The organic EL display device 1 according to an aspect 20 of the disclosure may be such that, in the aspects 1 to 19, a film thickness of the frame-shaped portion 23a is equal to or smaller than 15 nm. According to the configuration described above, the protection film can be etched by using a general etching solution.

The organic EL display device 1B according to an aspect 21 of the disclosure may be such that, in the aspects 1 to 18, the protection film 23B is formed of IZO. According to the configuration described above, even when the film thickness of the protection film is thicker than 15 nm, the protection film can be etched by using a general etching solution.

The organic EL display device 1C according to an aspect 22 of the disclosure may be such that, in the aspect 5 or 16, the first etching stopper layer (etching stopper layer 24) is formed of polycrystalline ITO.

A manufacturing method for the organic EL display device 1 according to an aspect 23 of the disclosure is a manufacturing method for an organic EL display device including a reflective electrode and a transparent electrode disposed facing each other with an organic EL layer interposed between the reflective electrode and the transparent electrode. The method includes forming a reflective film in which a first reflective film to become the reflective electrode is formed, film-forming a protection film in which a first protection film is formed on the first reflective film directly or with another layer interposed between the first protection film and the first reflective film in such a manner as to cover an entire surface of the first reflective film, and processing a protection film in which a formation region for the organic EL layer in the first protection film is removed, or a film thickness of the formation region for the organic EL layer is made thinner than a film thickness of a frame-shaped portion surrounding the formation region for the organic EL layer.

According to the configuration described above, it is possible to suppress a reduction in the reflectivity of the reflective electrode. Moreover, in the manufacturing process of the organic EL display device after forming the reflective film, the protection film may protect the reflective film from the factors that may degrade the quality of the reflective film.

A manufacturing method for the organic EL display device 1 according to an aspect 24 of the disclosure further includes, after the film-forming of the protection film, forming an edge cover in which an edge cover of a lattice pattern configured to cover edges of the reflective electrodes formed being aligned in a matrix shape. Further, in the processing of the protection film, the formation region for the organic EL layer in the first protection film is removed or a film thickness of the formation region for the organic EL layer is made thinner than a film thickness of the frame-shaped portion surrounding the formation region for the organic EL layer, by etching while using the edge cover as a mask.

According to the configuration described above, the opening or thin film portion of the protection film may be formed while using the edge cover as a mask. Because of this, it is unnecessary to separately provide a mask or the like in order to form the opening or thin film portion.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

REFERENCE SIGNS LIST 1, 1A-1C Organic EL display device
5 Display region
6 Frame region
10 TFT substrate
11 Support body
12 TFT
13 Passivation film (insulating film)
14 Interlayer insulating film (insulating film)
16 Wiring line (first wiring line)
24, 29 Etching stopper layer
20, 20A-20C Reflective electrode
21 Conductive film (first conductive film)
26, 26D1, 26D2 Conductive film (second conductive film)
22 Reflective film (first reflective film)
27, 27D1, 27D2 Reflective film (second reflective film)
23, 23A, 23B Protection film (first protection film)
28, 28B, 28D1, 28D2 Protection film (second protection film)
23a, 23Aa, 23Ba Frame-shaped portion
23b Opening
23Ab, 23Bb Thin film portion
25, 25C, 25D1, 25D2 Wiring line (second wiring line)
31 Edge cover
32 Organic EL layer
33 Transparent electrode
34 Sealing layer

The invention claimed is:
1. An organic EL display device comprising:
an organic EL layer;
a reflective electrode including a first reflective film;
a transparent electrode disposed opposite to the reflective electrode with the organic EL layer interposed between the reflective electrode and the transparent electrode;
a first protection film disposed on the reflective electrode and arranged between the reflective electrode and the organic EL layer;
an edge cover of a lattice pattern covering edges of the reflective electrode being aligned in a matrix shape;
an insulating film on which the reflective electrode is layered;
a first wiring line disposed on the insulating film; and
a second protection film disposed on the first wiring line and formed in a layer identical to the layer of the first protection film, wherein
the first protection film includes a frame-shaped portion surrounding a periphery of the organic EL layer in a frame shape, and a thin film portion surrounded by the frame-shaped portion and having a film thickness thinner than a film thickness of the frame-shaped portion,
the frame-shaped portion is covered by the edge cover,
a side surface of the edge cover in contact with the organic EL layer and a side surface of the frame-shaped portion in contact with the organic EL layer constitute a continuous plane,
the reflective electrode includes a first conductive film disposed on an opposite side of the first reflective film to a side on which the organic EL layer is disposed,
the first wiring line includes a second reflective film formed in a layer identical to the layer of the first reflective film, and a second conductive film formed in a layer identical to the layer of the first conductive film, and
the second protection film has a film thickness thicker than a film thickness of the second conductive film.

2. The organic EL display device according to claim 1, further comprising:
a switching element for pixel driving disposed for each pixel; and
a second wiring line formed in a layer identical to the layer of the switching element; wherein
the insulating film covers the switching element and the second wiring line, and
an organic EL element disposed for each pixel and including the reflective electrode, the transparent electrode and films between the reflective electrode and the transparent electrode, is connected to the switching element via a contact hole formed in the insulating film.

3. The organic EL display device according to claim 2, wherein the second wiring line is formed in a lattice pattern in the periphery of the reflective electrode.

4. The organic EL display device according to claim 2, wherein:
the second wiring line is electrically connected to the first wiring line.

5. The organic EL display device according to claim 1, wherein the first protection film is formed of ITO or IZO.

6. The organic EL display device according to claim 1, wherein the frame-shaped portion of the first protection film has a film thickness thicker than a film thickness of the first conductive film.

* * * * *